US011146752B2

(12) United States Patent
Araki et al.

(10) Patent No.: US 11,146,752 B2
(45) Date of Patent: Oct. 12, 2021

(54) SOLID-STATE IMAGING APPARATUS, DRIVING METHOD OF THE SOLID-STATE IMAGING APPARATUS, AND ELECTRONIC EQUIPMENT

(71) Applicant: Sony Corporation, Tokyo (JP)

(72) Inventors: Yuichiro Araki, Fukuoka (JP); Masaru Kikuchi, Kanagawa (JP)

(73) Assignee: Sony Corporation, Tokyo (JP)

(*) Notice: Subject to any disclaimer, the term of this patent is extended or adjusted under 35 U.S.C. 154(b) by 176 days.

(21) Appl. No.: 16/213,447

(22) Filed: Dec. 7, 2018

(65) Prior Publication Data
US 2019/0110011 A1 Apr. 11, 2019

Related U.S. Application Data

(63) Continuation of application No. 14/032,236, filed on Sep. 20, 2013, now abandoned, which is a (Continued)

(30) Foreign Application Priority Data

May 11, 2009 (JP) ................. 2009-114250

(51) Int. Cl.
H04N 5/378 (2011.01)
H01L 27/146 (2006.01)
(Continued)

(52) U.S. Cl.
CPC ......... H04N 5/378 (2013.01); H01L 27/1464 (2013.01); H01L 27/14643 (2013.01);
(Continued)

(58) Field of Classification Search
CPC ............... H04N 5/378; H04N 9/04511; H04N 9/04557; H04N 5/369; H04N 5/3742;
(Continued)

(56) References Cited

U.S. PATENT DOCUMENTS 4,768,084 A * 8/1988 Noda ................. H04N 9/04515
348/277
5,581,298 A * 12/1996 Sasaki ................ H04N 9/04515
348/222.1
(Continued)

FOREIGN PATENT DOCUMENTS

JP 2005-278135 A 10/2005

OTHER PUBLICATIONS

Notice of Allowance and Fees Due for U.S. Appl. No. 12/662,421, dated Jun. 28, 2013, 10 pages.
(Continued)

Primary Examiner — Georgia Y Epps
Assistant Examiner — Don J Williams
(74) Attorney, Agent, or Firm — Wolf, Greenfield & Sacks, P.C.

(57) ABSTRACT

A solid-state imaging apparatus includes: a pixel array section in which pixels including photoelectric conversion elements are two-dimensionally arranged in a matrix form, and a plurality of systematic pixel drive lines to transmit drive signals to read out signals from the pixels are arranged for each pixel row; and a row scanning section to simultaneously output the drive signals through the plurality of systematic pixel drive lines to a plurality of pixel rows for different pixel columns.

26 Claims, 15 Drawing Sheets

Related U.S. Application Data continuation of application No. 12/662,421, filed on Apr. 16, 2010, now Pat. No. 8,570,416.

(51) Int. Cl.
| | | |
|---|---|---|
| *H04N 5/345* | (2011.01) | |
| *H04N 5/374* | (2011.01) | |
| *H04N 5/3745* | (2011.01) | |
| *H04N 9/04* | (2006.01) | |
| *H04N 5/369* | (2011.01) | |

(52) U.S. Cl.
CPC ..... *H01L 27/14647* (2013.01); *H04N 5/3456* (2013.01); *H04N 5/369* (2013.01); *H04N 5/3742* (2013.01); *H04N 5/37455* (2013.01); *H04N 9/04511* (2018.08); *H04N 9/04557* (2018.08); *H01L 27/14621* (2013.01); *H01L 27/14627* (2013.01); *H01L 27/14636* (2013.01)

(58) Field of Classification Search
CPC .. H04N 5/37455; H04N 9/045; H04N 5/3456; H01L 27/1464; H01L 27/14643; H01L 27/14621; H01L 27/14627; H01L 27/14636; H01L 27/14647
See application file for complete search history.

(56) References Cited

U.S. PATENT DOCUMENTS

| | | | | |
|---|---|---|---|---|
| 6,067,113 | A * | 5/2000 | Hurwitz | ............... H04N 5/3658 348/241 |
| 6,252,217 | B1 | 6/2001 | Pyyhtia et al. | |
| 6,956,605 | B1 | 10/2005 | Hashimoto | |
| 7,623,173 | B2 | 11/2009 | Nitta et al. | |
| 7,839,977 | B2 | 11/2010 | Kameshima et al. | |
| 8,018,511 | B2 | 9/2011 | Sowa et al. | |
| 8,488,035 | B2 | 7/2013 | Kondo et al. | |
| 2005/0083420 | A1 | 4/2005 | Koseki et al. | |
| 2005/0185073 | A1 | 8/2005 | Watanabe | |
| 2007/0126901 | A1 | 6/2007 | Kuroda | |
| 2008/0198251 | A1 | 7/2008 | Xu | |
| 2008/0258042 | A1 | 10/2008 | Krymski | |
| 2009/0195683 | A1 | 8/2009 | Honda et al. | |
| 2010/0271523 | A1 | 10/2010 | Hara | |

OTHER PUBLICATIONS

Final Rejection for U.S. Appl. No. 12/662,421, dated Mar. 22, 2013, 16 pages.
Non-Final Rejection for U.S. Appl. No. 12/662,421, dated Sep. 12, 2012, 11 pages.
Final Rejection for U.S. Appl. No. 14/032,236, dated Sep. 6, 2018, 15 pages.
Non-Final Rejection for U.S. Appl. No. 14/032,236, dated Feb. 5, 2018, 11 pages.
Non-Final Rejection for U.S. Appl. No. 14/032,236, dated Jul. 7, 2017, 11 pages.
Advisory Action for U.S. Appl. No. 14/032,236, dated Apr. 14, 2017, 03 pages.
Final Rejection for U.S. Appl. No. 14/032,236, dated Jan. 26, 2017, 13 pages.
Non-Final Rejection for U.S. Appl. No. 14/032,236, dated Jul. 20, 2016, 09 pages.
Non-Final Rejection for U.S. Appl. No. 14/032,236, dated Sep. 29, 2015, 09 pages.
Non-Final Rejection for U.S. Appl. No. 14/032,236, dated Jan. 14, 2015, 08 pages.

* cited by examiner

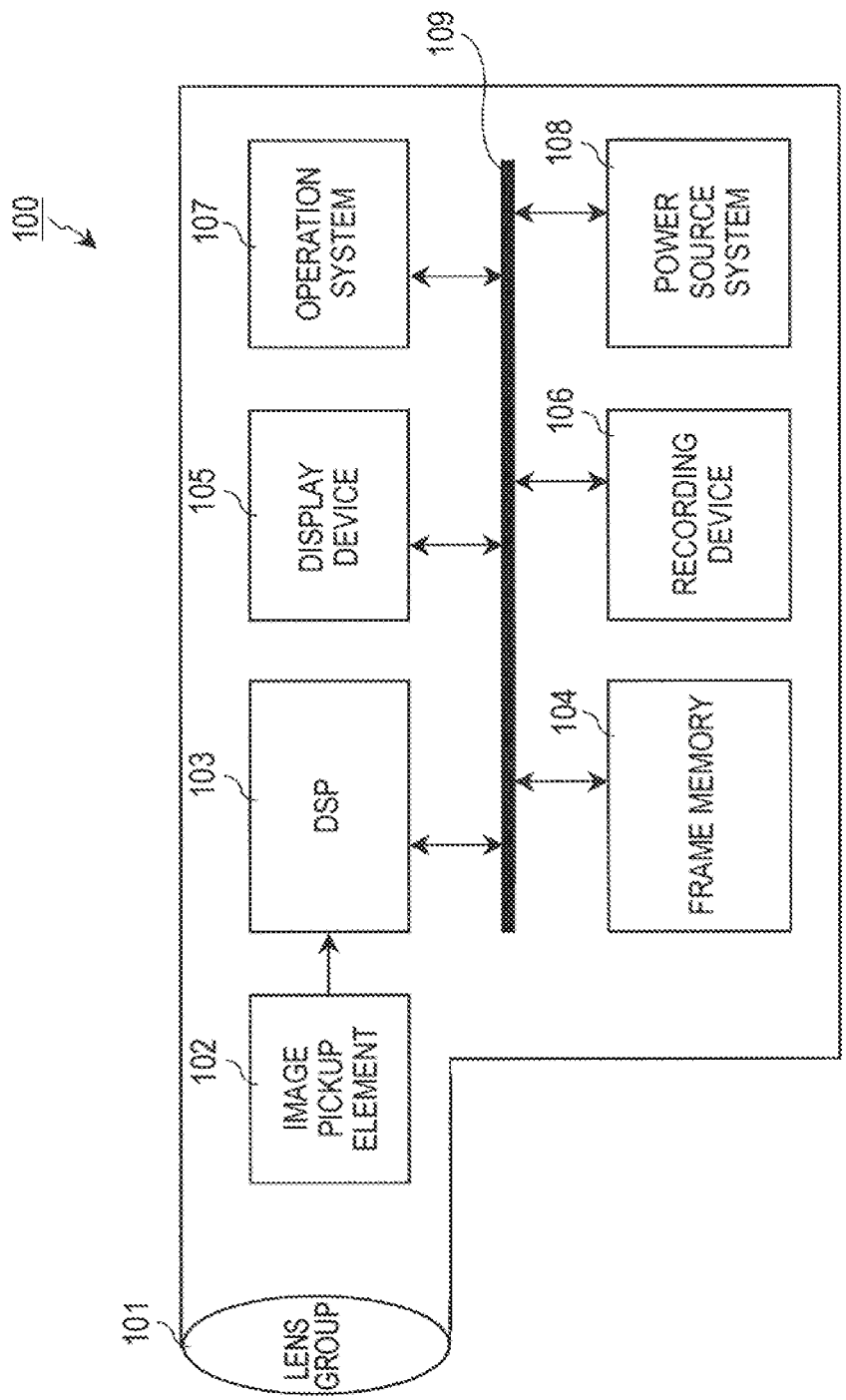

SOLID-STATE IMAGING APPARATUS, DRIVING METHOD OF THE SOLID-STATE IMAGING APPARATUS, AND ELECTRONIC EQUIPMENT

CROSS-REFERENCE TO RELATED APPLICATIONS

The present application is a continuation application of U.S. patent application Ser. No. 14/032,236, filed Sep. 20, 2013, which is a continuation application of U.S. patent application Ser. No. 12/662,421, filed Apr. 16, 2010, now U.S. Pat. No. 8,570,416, which claims priority from prior Japanese Priority Patent Application 2009-114250 filed in the Japan Patent Office on May 11, 2009, the entire contents of which are hereby incorporated by reference.

BACKGROUND OF THE INVENTION

1. Field of the Invention

The present invention relates to a solid-state imaging apparatus, a driving method of the solid-state imaging apparatus and an electronic equipment.

2. Description of the Related Art

An imaging apparatus, such as a digital still camera, to convert light into an electric signal and to output an image signal includes a solid-state imaging apparatus as an image capture section (photoelectric conversion section). In the field of the solid-state imaging apparatus, in recent years, as the number of pixels is increased and a frame rate is raised, a technology of realizing high-speed reading and a technology of realizing low power consumption become essential technologies.

As a type of solid-state imaging apparatus, there is a CMOS (including a MOS) image sensor (hereinafter referred to as "CMOS image sensor") taking advantage of a feature that it can be manufactured by the same process as a CMOS integrated circuit. The CMOS image sensor adopts such a structure that an electric charge is converted into an electric signal for each pixel, and the electric signals read from the pixels are processed in parallel for respective pixel columns. The readout rate of the pixel signals can be increased by the parallel processing for the respective pixel columns.

Hitherto, as a CMOS image sensor to read out signals in parallel for respective pixel columns from plural pixels arranged in a matrix form, there is known a column AD conversion type one which performs analog-to-digital conversion (hereinafter referred to as "AD conversion") of pixel signals for the respective pixel columns (JP-A-2005-278135 (Patent document 1)).

The column AD conversion type CMOS image sensor adopts such a structure that signal readout lines (hereinafter referred to as "vertical signal lines") are shared in the vertical direction of pixels two-dimensionally arranged in a matrix form, and an AD conversion circuit and a readout circuit are provided for each of the pixel columns. Then, the AD conversion circuits and the readout circuits are simultaneously driven, so that the simultaneous signal processing equivalent to the total number of pixel columns is performed.

The AD conversion circuit compares an analog pixel signal given through the vertical signal line with a reference signal of a linearly changing slope waveform having an inclination for each pixel column by a comparator, and starts a count operation of a counter. The counter performs the count operation in synchronization with a clock of a constant period.

Thereafter, the AD conversion circuit stops the count operation of the counter at the inverting timing of the output of the comparator when the analog pixel signal intersects with the reference signal. The final count value of the counter becomes the digital signal corresponding to the magnitude of the analog pixel signal. As described above, the column AD conversion system is a readout system characterized by high-speed image pickup since the pixel signals of one row are simultaneously A/D converted.

SUMMARY OF THE INVENTION

In recent years, the request for high-speed image pickup is more and more increased. In the column AD conversion type CMOS image sensor, the number of vertical readout lines (number of rows/number of lines) is reduced to meet the request. As a method of reducing the number of vertical readout lines, there is a method of interlaced scanning such as, for example, vertical thinning-out readout in which a pixel row is skipped at a constant row period, or vertical segmentation in which signals of pixels in a specific area in the vertical direction are read out. However, there arises a problem that when the number of readout lines is reduced by the thinning-out readout, the resolution is degraded, and when the number of vertical readout lines is reduced by the interlaced scanning, a pickup image becomes long sideways by reduction in angle of view.

It is therefore desirable to provide a solid-state imaging apparatus in which degradation of resolution at the time of vertical thinning-out readout can be reduced, and it is possible to prevent a pickup image from becoming long sideways by suppressing the reduction in angle of view when pixel rows are interlace-scanned, a driving method of the solid-state imaging apparatus and an electronic equipment.

According to an embodiment of the present invention, there is provided a solid-state imaging apparatus including a pixel array section in which pixels including photoelectric conversion elements are two-dimensionally arranged in a matrix form, and plural systematic pixel drive lines to transmit drive signals to read out signals from the pixels are arranged for each pixel row, and a row scanning section to simultaneously output the drive signals through the plural systematic pixel drive lines to plural pixel rows for different pixel columns.

The row scanning section simultaneously outputs the drive signals of the pixels to the plural pixel rows in the different pixel columns through the plural systematic pixel drive lines, so that plural pixel rows in the different pixel columns can be simultaneously scanned. By this, with respect to the plural pixel rows, signals are read out from a part of the pixels, not all the pixels of one pixel row. In other words, when attention is paid to one pixel row, signals of a part of pixels are thinned out at the time of signal readout. By this horizontal thinning-out readout, the number of signals in the horizontal direction can be reduced. Thus, as compared with a case where the horizontal thinning-out readout is not performed, the frame rate can be increased, and when pixel rows are interlace-scanned, the reduction in angle of view can be suppressed.

According to another embodiment of the present invention, there is provided a solid-state imaging apparatus including a pixel array section in which pixels including photoelectric conversion elements are two-dimensionally arranged in a matrix form, and plural systematic signal lines to transmit signals read out from the pixels are arranged for each pixel column, and a row scanning section to simultaneously output drive signals to read out the signals from the pixels to plural pixel rows.

The row scanning section simultaneously output the drive signals of the pixels to the plural pixel rows, so that the signals of the pixels are read out to the plural systematic signal lines from the plural pixel rows. At this time, when one of the plural systematic signal lines is selected for each pixel column, with respect to the plural pixel rows, signals are read out from a part of pixels, not all the pixels of one pixel row. In other words, when attention is paid to one pixel row, signals of a part of pixels are thinned out at the time of signal readout. By this horizontal thinning-out readout, the number of signals in the horizontal direction can be reduced. Thus, as compared with the case where the horizontal thinning-out readout is not performed, the frame rate can be increased, and when pixel rows are interlace-scanned, the reduction in angle of view can be suppressed.

According to the embodiments of the present invention, when the pixel rows are interlace-scanned, the horizontal thinning-out readout is performed, so that the reduction in angle of view can be suppressed, and therefore, it is possible to prevent the pickup image from becoming long sideways.

BRIEF DESCRIPTION OF THE DRAWINGS

FIG. 16 is a block diagram showing a structural example of an imaging apparatus as an example of an electronic equipment according to the embodiment of the invention.

DESCRIPTION OF PREFERRED EMBODIMENTS

Hereinafter, modes for carrying out the invention (hereinafter referred to as "embodiments") will be described in detail with reference to the drawings. Incidentally, the description is made in the following order.
1. Solid-state imaging apparatus to which the invention is applied.
2. First embodiment (example in which two systematic pixel drive lines are provided for each pixel row)
3. Second embodiment (example in which two systematic vertical signal lines are provided for each pixel row)
4. Third embodiment (example of vertical pixel addition)
5. Fourth embodiment (example of horizontal thinning-out readout+vertical pixel addition)
6. Back surface incident type pixel structure
7. Electronic equipment (example of imaging apparatus)

Figure 1:
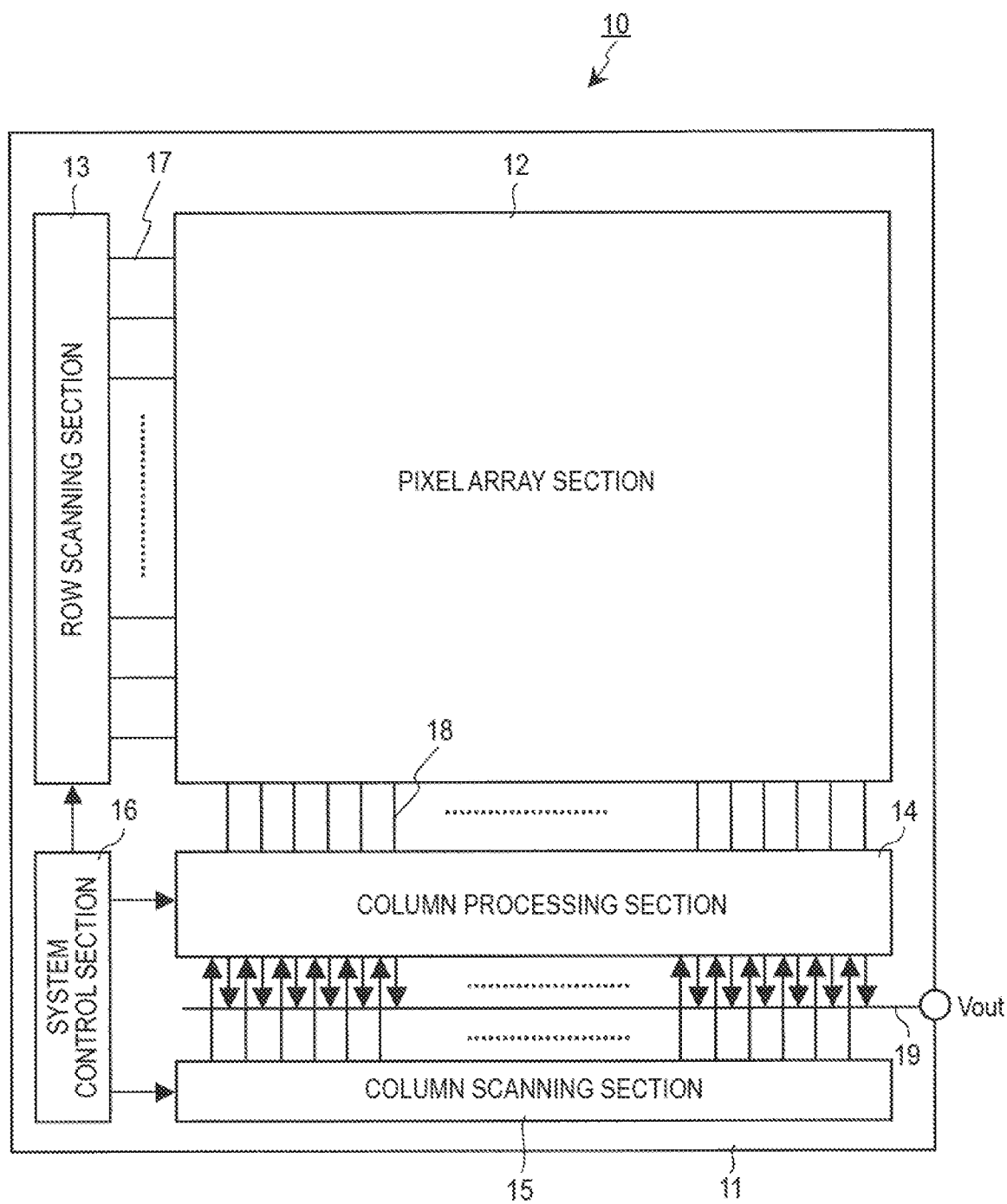
FIG. 1 is a system structural view showing the outline of a system structure of a CMOS image sensor to which the invention is applied.

1. Solid-State Imaging Apparatus to which the Invention is Applied (System Structure)
FIG. 1 is a system structural view showing the outline of a solid-state imaging apparatus to which the invention is applied, for example, a CMOS image sensor as a kind of X-Y address type solid-state imaging apparatus. Here, the CMOS image sensor is an image sensor prepared by using a CMOS process or by partially using it.

A CMOS image sensor 10 of an applied example includes a pixel array section 12 formed on a semiconductor substrate (hereinafter sometimes referred to as "chip") 11, and a peripheral circuit section integrated on the same chip 11 as the pixel array section 12. In this example, as the peripheral circuit section, for example, a row scanning section 13, a column processing section 14, a column scanning section 15 and a system control section 16 are provided.

In the pixel array section 12, unit pixels (hereinafter simply sometimes referred to as "pixels") each including a photoelectric conversion element to generate photocharge having a charge amount corresponding to the amount of incident light and to store it in the inside are two-dimensionally arranged in a matrix form. A specific structure of the unit pixel will be described later.

Further, in the pixel array section 12, a pixel drive line 17 is arranged along a horizontal direction/row direction (pixel arrangement direction of a pixel row) for each pixel row in the matrix pixel arrangement, and a vertical signal line 18 is arranged along a vertical direction/column direction (pixel arrangement direction of a pixel column) for each pixel column. The pixel drive line 17 transmits a drive signal to read a signal from a pixel. Although FIG. 1 shows that the pixel drive line 17 is one wiring line, no limitation is made to one line. One end of the pixel drive line 17 is connected to an output end of the row scanning section 13 corresponding to each row.

The row scanning section 13 includes a shift register, an address decoder and the like, and is a pixel drive section to drive the respective pixels of the pixel array section 12 simultaneously for all the pixels or in units of a row. Although the illustration of a specific structure of the row scanning section 13 is omitted, the row scanning section generally includes two scanning systems of a readout scanning system and a sweep-out scanning system.

The readout scanning system successively selects and scans the unit pixels of the pixel array section 12 in units of a row in order to read out signals from the unit pixels. The signal read out from the unit pixel is an analog signal. The sweep-out scanning system performs sweep-out scanning on the readout rows, which are to be subjected to readout scanning by the readout scanning system, earlier than the readout scanning by a time equivalent to a shutter speed.

An unnecessary charge is swept out from the photoelectric conversion element of the unit pixel of the readout row by the sweep-out scanning of the sweep-out scanning system, so that the photoelectric conversion element is reset. Then, the so-called electronic shutter operation is performed by the sweep-out (reset) of the unnecessary charge by the sweep-out scanning system. Here, the electronic shutter operation is an operation to discharge the photocharge of the photoelectric conversion element and to newly start exposure (start storage of photocharge).

The signal read out by the readout operation of the readout scanning system corresponds to the amount of light incident after the immediately preceding readout operation or the electronic shutter operation. A period from the readout timing of the immediately preceding readout operation or the sweep-out timing of the electronic shutter operation to the readout timing of this readout operation is a storage period (exposure period) of photocharge in the unit pixel.

The signal outputted from each of the unit pixels of the pixel row selected and scanned by the row scanning section 13 is supplied to the column processing section 14 through each of the vertical signal lines 18. For each pixel column of the pixel array section 12, the column processing section 14 performs a specified signal processing on the signal outputted through the vertical signal line 18 from each pixel of the selected row, and temporarily holds the pixel signal after the signal processing.

Specifically, the column processing section 14 receives the signal of the unit pixel, and performs the signal processing such as, for example, noise removal by CDS (Correlated Double Sampling), signal amplification or AD (Analog-to-Digital) conversion, on the signal. A reset noise or a fixed pattern noise intrinsic to a pixel, such as threshold variation of an amplification transistor, is removed by the noise removal processing. Incidentally, the signal processings exemplified here are merely examples, and the signal processing is not limited to these.

The column scanning section 15 includes a shift register, an address decoder and the like, and successively selects a unit circuit of the column processing section 14 corresponding to the pixel column. The pixel signal subjected to the signal processing by the column processing section 14 is successively outputted to a horizontal bus 19 by select scanning of the column scanning section 15, and is transmitted to the outside of the chip 11 through the horizontal bus 19.

The system control section 16 receives a clock given from the outside of the chip 11 and data to instruct an operation mode, and outputs data such as inner information of the CMOS image sensor 10. The system control section 16 further includes a timing generator to generate various timing signals, and performs drive control of the peripheral circuit section, such as the row scanning section 13, the column processing section 14 and the column scanning section 15, based on the various timing signals generated by the timing generator.

(Circuit Structure of Unit Pixel)

Figure 2:
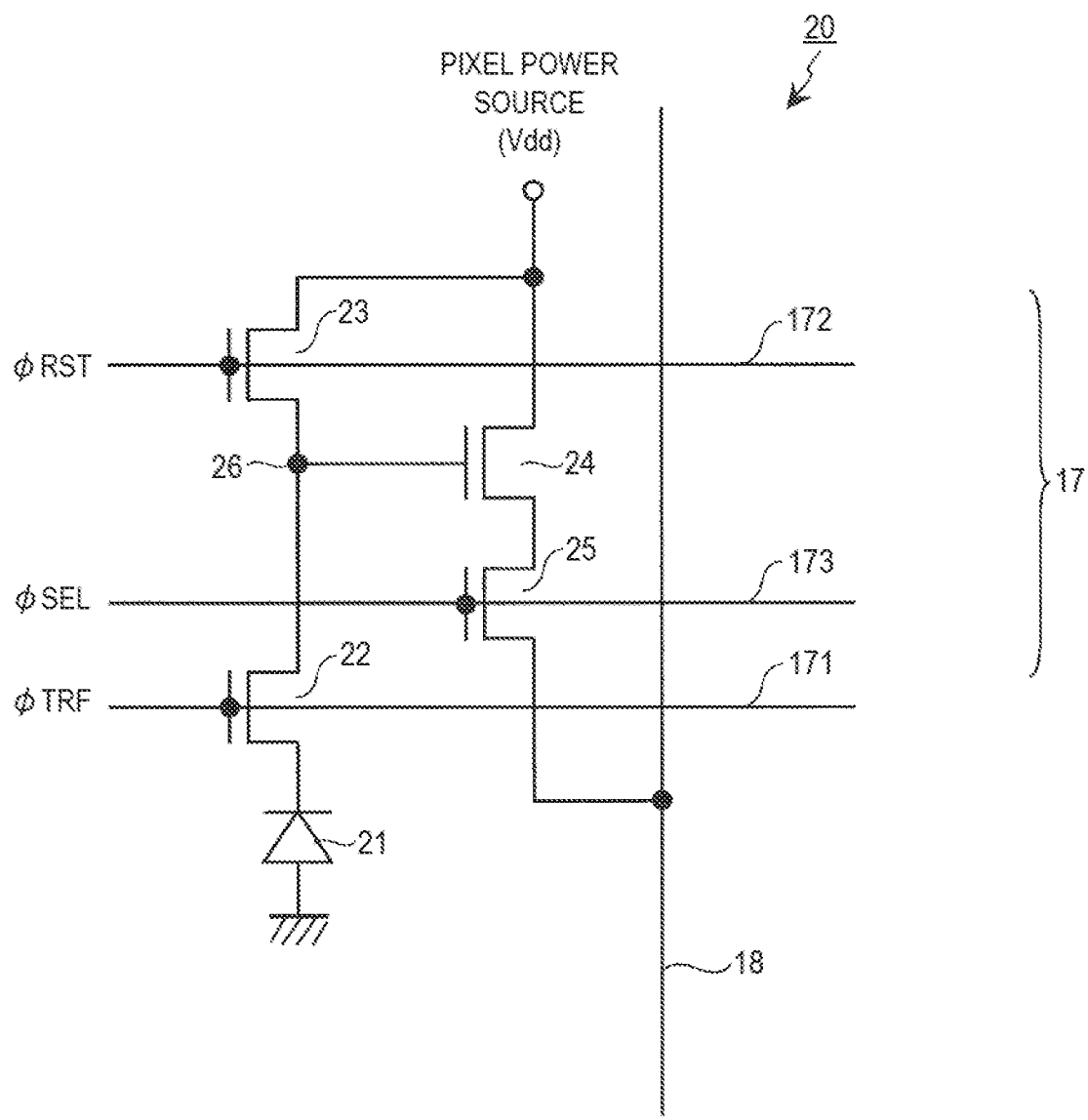
FIG. 2 is a circuit diagram showing an example of a circuit structure of a unit pixel.

FIG. 2 is a circuit diagram showing an example of a circuit structure of a unit pixel 20. As shown in FIG. 2, the unit pixel 20 of this circuit example includes, for example, four transistors of a transfer transistor 22, a reset transistor 23, an amplification transistor 24 and a select transistor 25 in addition to, for example, a photodiode 21 as a photoelectric conversion section.

Here, as the four transistors 22 to 25, for example, N-channel MOS transistors are used. However, the combination of the conductivity types of the transfer transistor 22, the reset transistor 23, the amplification transistor 24 and the selection transistor 25 exemplified here is merely an example, and no limitation is made to the combination of these.

In regard to this unit pixel 20, as the pixel drive line 17, for example, three drive wiring lines of a transfer line 171, a reset line 172 and a selection line 173 are provided in common to the respective pixels of the same pixel row. The respective ends of the transfer line 171, the reset line 172 and the selection line 173 are connected to the output end of the row scanning section 13 corresponding to each pixel row in units of a pixel row, and the respective lines transmit a transfer pulse φTRF, a reset pulse φRST and a selection pulse φSEL which are drive signals to drive the pixel 20.

An anode electrode of the photodiode 21 is connected to a negative-side power source (for example, ground), and the photodiode photoelectric-converts the received light into photocharge (here, photoelectron) having a charge amount corresponding to the amount of the light, and stores the photocharge. A cathode electrode of the photodiode 21 is electrically connected to a gate electrode of the amplification transistor 24 through the transfer transistor 22. A node 26 electrically connected to the gate electrode of the amplification transistor 24 is called an FD (Floating Diffusion) section.

The transfer transistor 22 is connected between the cathode electrode of the photodiode 21 and the FD section 26. The transfer pulse φTRF whose high level (for example, Vdd level) is active (hereinafter referred to as "High active") is given through the transfer line 171 to the gate electrode of the transfer transistor 22. By this, the transfer transistor 22 is placed in an ON state, and transfers the photocharge generated by the photoelectric conversion of the photodiode 21 to the FD section 26.

The drain electrode of the reset transistor 23 is connected to the pixel power source Vdd, and the source electrode thereof is connected to the FD section 26. The high active reset pulse φRST is given to the gate electrode of the reset transistor 23 through the reset line 172. By this, the reset transistor 23 is placed in an ON state, and resets the FD section 26 by discharging the charge of the FD section 26 to the pixel power source Vdd.

The gate electrode of the amplification transistor 24 is connected to the FD section 26, and the drain electrode thereof is connected to the pixel power source Vdd. The amplification transistor 24 outputs, as a reset signal (reset level) Vreset, the potential of the FD section 26 after it is reset by the reset transistor 23. Further, the amplification transistor 24 outputs, as a light storage signal (signal level) Vsig, the potential of the FD section 26 after the signal charge is transferred by the transfer transistor 22.

For example, the drain electrode of the selection transistor 25 is connected to the source electrode of the amplification transistor 24, and the source electrode thereof is connected to the vertical signal line 18. The high active selection pulse φSEL is given to the gate electrode of the selection transistor 25 through the selection line 173. By this, the selection transistor 25 is placed in an ON state, brings the unit pixel 20 into a selected state, and relays the signal outputted from the amplification transistor 24 to the vertical signal line 18.

Incidentally, with respect to the selection transistor 25, a circuit structure in which it is connected between the pixel power source Vdd and the drain of the amplification transistor 24 can also be adopted.

Besides, the unit pixel 20 is not limited to the pixel structure including the four transistors. For example, a pixel structure including three transistors in which a transistor is used as both the amplification transistor 24 and the selection transistor 25 may be adopted, and the structure of the pixel circuit is not limited.

2. First Embodiment

Figure 3:
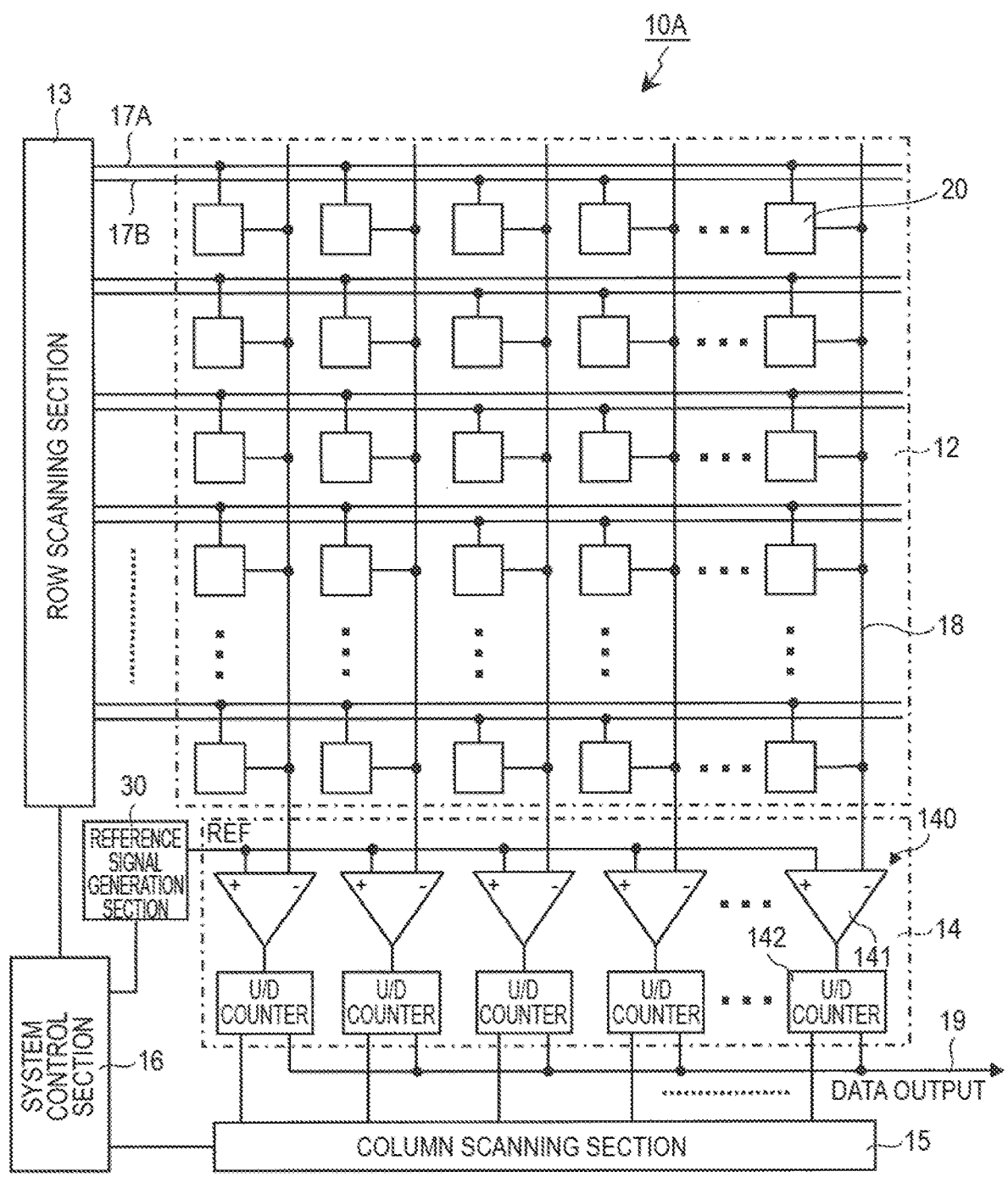
FIG. 3 is a system structural view showing the outline of a system structure of a CMOS image sensor of a first embodiment of the invention.

FIG. 3 is a system structural view showing the outline of a system structure of a CMOS image sensor 10A of a first embodiment of the invention. In the drawing, the same portion as that of FIG. 1 is denoted by the same reference numeral.

The CMOS image sensor 10A of this embodiment is constructed such that plural, for example, two systematic pixel drive lines 17 are arranged for each pixel row. Unit pixels 20 are connected to the two systematic pixel drive lines 17A and 17B in units of two adjacent columns. Specifically, the connection relation is such that from the left in the drawing, the respective pixels 20 of the first pixel column and the second pixel column are connected to the pixel drive line 17A, the respective pixels 20 of the third pixel column and the fourth pixel column are connected to the pixel drive line 17B, the respective pixels 20 of the fifth pixel column and the sixth pixel column are connected to the pixel drive line 17A, and so on.

The unit pixel 20 is driven through one of the two systematic pixel drive liens 17A and 17B. Incidentally, in FIG. 3, each of the two systematic pixel drive lines 17A and 17B is shown as one line. However, when the unit pixel 20 has the pixel structure shown in FIG. 2, each of the pixel drive lines 17A and 17B includes, for example, the three wiring lines of the transfer line 171, the reset line 172 and the selection line 173.

The respective pixels 20 may be directly connected to the pixel drive lines 17A and 17B, or may be connected to them through switches when there is room in the size of the chip 11. As an example, a case where the pixel drive lines 17 as the object of line connection are the transfer lines 171 (171A, 171B) will be specifically described with reference to FIGS. 4A and 4B.

Figure 4A:
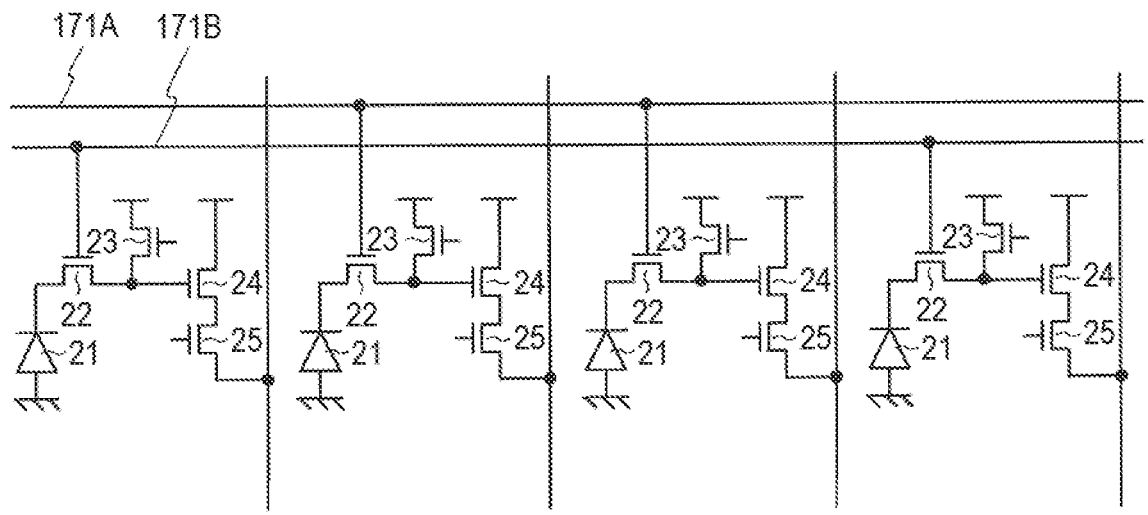
FIGS. 4A and 4B are connection diagrams showing connection examples of unit pixels to two systematic pixel drive lines.
Figure 4B:
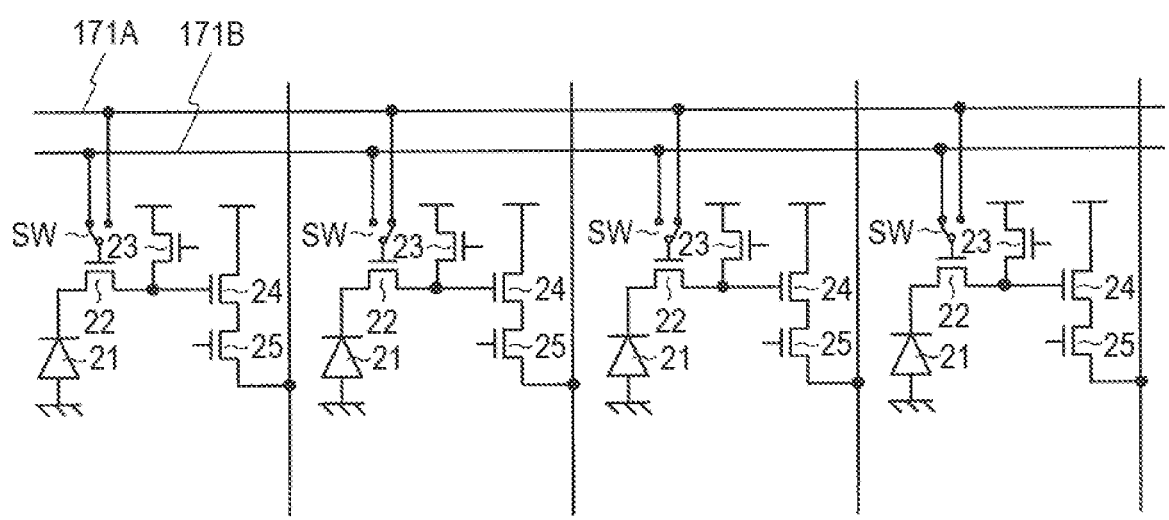

In FIGS. 4A and 4B, in the case of the direct connection (FIG. 4A), similarly to FIG. 2 and FIG. 3, the gate electrodes of the transfer transistors 22 are directly connected to the transfer lines 171A and 171B in units of two adjacent columns. In the case of the connection (FIG. 4B) where the switch intervenes, the gate electrodes of the transfer transistors 22 are connected to the transfer lines 171A and 171B through switches SW for all pixel rows.

When the switches SW are placed in the switched state as shown in, for example, FIG. 4B, the same connection relation as that of FIG. 4A can be obtained. That is, according to the connection example (FIG. 4B) in which the switch SW intervenes, by switching over the switch SW, it is possible to select which of the transfer lines 171A and 171B is connected to the gate electrode of the transfer transistor 22. Accordingly, the rearrangement of connection between the transfer lines 171A and 171B and the unit pixel 20 can be freely performed.

The two systematic pixel drive lines 17A and 17B are arranged for each pixel, while a row scanning section 13 can selectively adopt a mode of scanning a single pixel row and a mode of simultaneously scanning plural pixel rows. The mode is switched over under the control of a control section 16 based on a designation from the outside.

In the case of the scan mode of a single pixel row, the row scanning section 13 simultaneously outputs drive signals (transfer pulse φTRF, reset pulse φRST and selection pulse φSEL) to the single pixel row through the two systematic pixel drive lines 17A and 17B. According to the row scan of the row scanning section 13, similarly to the related art, while the readout row is successively selected for each pixel row, the signals can be read out from the respective pixels of the selected row.

In the case of the simultaneous scan mode of plural pixel rows, the row scanning section 13 simultaneously outputs drive signals (transfer pulse φTRF, reset pulse φRST and selection pulse φSEL) to plural image rows, in this example, two pixel rows through the two systematic pixel drive lines 17A and 17B. According to the row scan of the row scanning section 13, the readout row from which the pixel signal is read out can be selected for each pixel column. As a result, in the case of this example, two-row simultaneous readout can be performed for different pixel columns.

The simultaneous output of the drive signals to the two pixel rows can be easily realized in such a manner that in the row scanning section 13, two addresses of the pixel rows as the object of the simultaneous readout are specified, or one address is specified, and the thinning number (number of rows) or the simultaneous selection number is specified. In the example of the address designation here, it is presumed that the row scanning section 13 is constructed by using an address decoder.

However, also in the case where the row scanning section 13 is constructed by using a shift register, the drive signals can be simultaneously outputted to plural pixel rows. Specifically, for example, a case where two pixel rows are simultaneously selected can be realized in such a manner that the scan sections 13 is constructed by using two shift registers, and the scan start timings of the two shift registers are shifted by a scan time difference between two pixel rows as the object of the simultaneous readout. In any case, the row scanning section 13 drives the respective pixels 20 so that signals of plural pixels 20 are not simultaneously read to one vertical signal line 18.

A column processing section 14 adopts a column AD conversion system in which an analog pixel signal is converted into a digital signal for each pixel column. The column processing section 14 of the column AD conversion system has such a structure that an AD conversion circuit 140 of a circuit structure including at least a comparator 141 and a counter 142 is made a unit circuit, and the AD conversion circuit 140 is arranged correspondingly to each pixel column of a pixel array section 12.

In the case of the column AD conversion system, the CMOS image sensor 10A includes a reference signal generation section 30 to generate a reference signal to be given to the column processing section 14. The reference signal generation section 30 includes, for example, a DA (Digital-to-Analog) conversion circuit, and generates the reference signal REF of a slope waveform (so-called RAMP waveform) having an inclination and linearly changed. The reference signal REF is given to one input terminal (for example, non-inverting input terminal) of the comparator 141 in common to all pixel columns.

The comparator 141 compares the analog pixel signal given to the other input terminal (for example, inverting input terminal) through the vertical signal line 18 with the reference signal REF for each pixel column. At this time, the counter 142 simultaneously starts a count operation. The counter 142 includes, for example, an up (U)/down (D) counter, and performs the count operation in synchronization with a clock with a constant period.

When the analog pixel signal intersects with the reference REF, the output of the comparator 141 is inverted. The counter 142 stops the count operation at the inversion timing of the output of the comparator 141. The final count value of the counter 142 becomes digital data (pixel data) corresponding to the magnitude of the analog pixel signal. The digital data is successively read to a horizontal bus 19 through a horizontal scan switch (not shown) successively turned on in synchronization with the column scan by the column scanning section 15.

(Simultaneous Scan Mode of Plural Pixel Rows)

Next, a specific drive example of the CMOS image sensor 10A in the case of a mode where plural pixel rows are simultaneously scanned will be described.

Here, a description will be made with reference to an operation explanatory view of FIG. 6 while using, as an example, a case where color coding of color filters arranged on the pixel array section 12 is, as shown in, for example, FIGS. 5A and 5B, R (red), G (green) and B (blue) Bayer arrangement. FIG. 6 shows a pixel arrangement of four vertical pixels×four horizontal pixels for simplification of the drawing. Besides, in FIG. 6, a pixel of a readout object is surrounded by a thick line.

In this operation explanation, as an example, vertical ⅓ thinning-out readout is performed in which three pixel rows are made one unit, two rows among the three rows are skipped, and signals are read out from pixels of the remaining one row. Since the number of vertical readout lines (number of rows/number of lines) can be reduced by performing the vertical thinning-out readout, as compared with the case where the vertical thinning-out readout is not performed, high-speed image pickup can be realized.

When the vertical ⅓ thinning-out readout is performed, the row scanning section 13 simultaneously outputs drive signals (transfer pulse φTRF, reset pulse φRST and selection pulse φSEL) through the one pixel drive lines 17A to the first pixel row and the fourth pixel row from above.

By the row scan of the row scanning section 13, the signal of the R pixel and the signal of the G pixel are read out from the first pixel row at intervals of two pixels, and the signal of the G pixel and the signal of the B pixel are read outer from the fourth pixel row at intervals of two pixels. That is, in addition to the vertical ⅓ thinning-out readout, horizontal 2/4 thinning-out readout is performed by the two-row simultaneous readout.

As described above, for example, two systematic pixel drive lines 17A and 17B are arranged for each pixel row, and the respective pixels 20 are connected to the pixel drive lines 17A and 17B while two adjacent columns are made a unit, so that two pixel rows can be simultaneously scanned for different pixel columns. By this, in the above example, while the vertical ⅓ thinning-out readout is performed, the horizontal 2/4 thinning-out readout can be performed.

When attention is paid to one pixel row, since the number of readout pixels in the horizontal direction is halved by the horizontal 2/4 thinning-out readout, as compared with the case where the horizontal thinning-out readout is not performed, the frame rate can be increased. Further, since the number of readout pixels in the horizontal direction can be reduced, it is possible to eliminate the disadvantage that the angle of view is reduced as in the case where the horizontal thinning-out readout is not performed, and it is possible to prevent the pickup image from becoming long sideways.

Incidentally, in the operation example, although the description is made while using, as the example, the case where the two-row simultaneous readout is performed, no limitation is made to the two-row simultaneous readout. In the case of three-row simultaneous readout, the number of readout pixels in the horizontal direction can be reduced to ⅓, and in the case of four-row simultaneous readout, the number of readout pixels in the horizontal direction can be reduced to ¼.

Besides, in the operation example, in order to reduce the vertical readout number (number of rows/number of lines), the case of using the vertical thinning-out readout method to skip the pixel row at the constant row period is used as the example, however, no limitation is made to this method. For example, a method of vertical segmentation to read signals of pixels within a specific area in the vertical direction can be used, or both the method of vertical thinning-out readout and the method of vertical segmentation can be used.

Figure 7A:
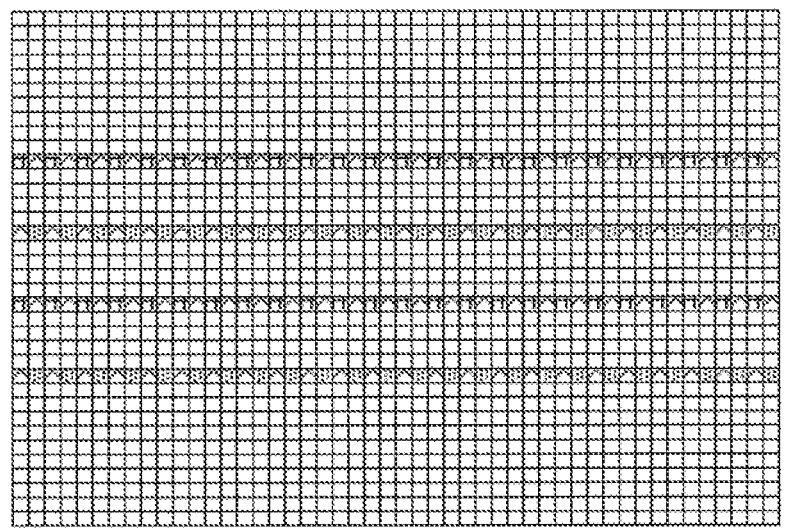
FIGS. 7A, 7B and 7C are views for explaining the operation and effect of the CMOS image sensor of the first embodiment.

Incidentally, in the related art method in which the horizontal thinning-out is not performed, when the vertical segmentation to segment ½ of the pixel area in the vertical direction is performed, and the vertical ⅕ thinning-out readout is performed in the segmented area, as shown in FIG. 7A, there occurs a disadvantage that the angle of view is reduced.

Figure 7B:
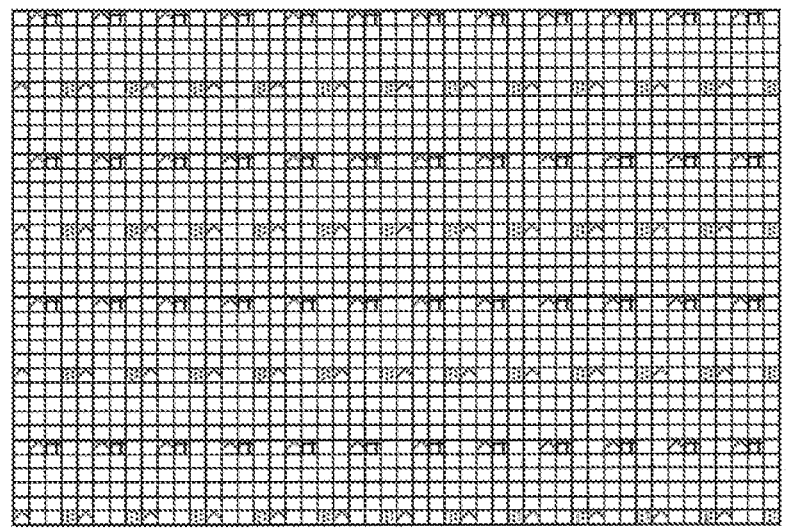
Figure 7C:
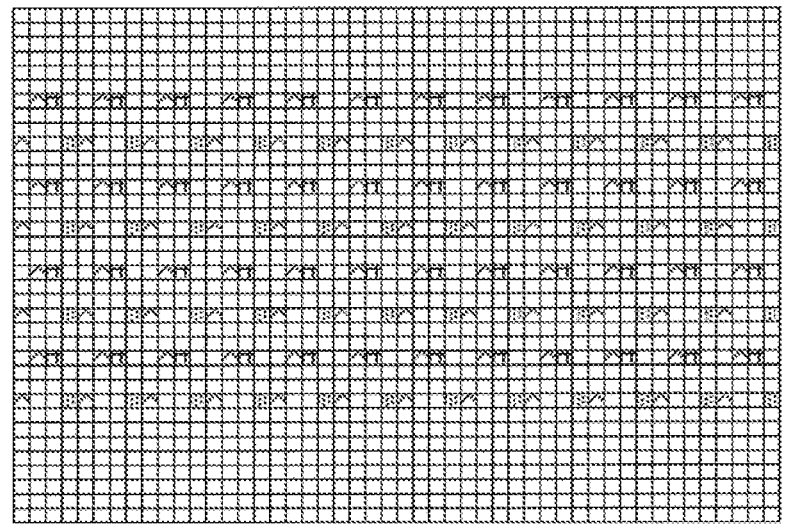

On the other hand, when the horizontal 2/4 thinning-out readout is performed while the vertical ⅕ thinning-out readout is performed without performing the vertical segmentation, as shown in FIG. 7B, the angle of view can be improved as compared with the related art method. Besides, when the vertical segmentation to cut out ⅔ of the pixel area in the vertical direction is performed, and the horizontal 2/4 thinning-out readout is performed while the vertical ⅓ thinning-out readout is performed in this segmented area, as shown in FIG. 7C, the angle of view and the vertical resolution can be improved as compared with the related art method.

The analog pixel signal read out by the row scan of the row scanning section 13 is converted into digital data by the AD conversion circuit 140, and then is outputted to the outside of the chip 11 through the horizontal bus 19 by the column scan of the column scanning section 15. When scanning is performed in sequence from the end at the time of the column scan performed by the column scanning section 15, the pixel data is outputted over two rows.

Specifically, in the case of the example of FIG. 6, the data of the R pixel and the data of the G pixel of the first row are successively outputted, and next, the data of the G pixel and the data of the B pixel of the fourth row are successively outputted, and after that, the data of two pixels of R and G of the first row and the data of two pixels of G and B of the fourth row are alternately outputted. These signals are supplied to a data processing section (for example, DSP (Digital Signal Processor) circuit) provided on the outside of the chip 11.

The latter stage data processing section performs signal processing corresponding to the output over two rows on the pixel data outputted over two rows. Specifically, as an example, signal processing for each row may be performed after pixel data of two rows is read.

Besides, when compatibility of the data processing section to the normal one-row readout and the two-row simultaneous readout is raised, a following method may be adopted. That is, a method may be adopted in which an image memory such as a line memory or a frame memory is used, the pixel data is once stored in the image memory, and the pixel data is rearranged in order of pixel row and is output, or a method may be adopted in which the image data is outputted in order of pixel row by changing the column scan order.

Figure 8:
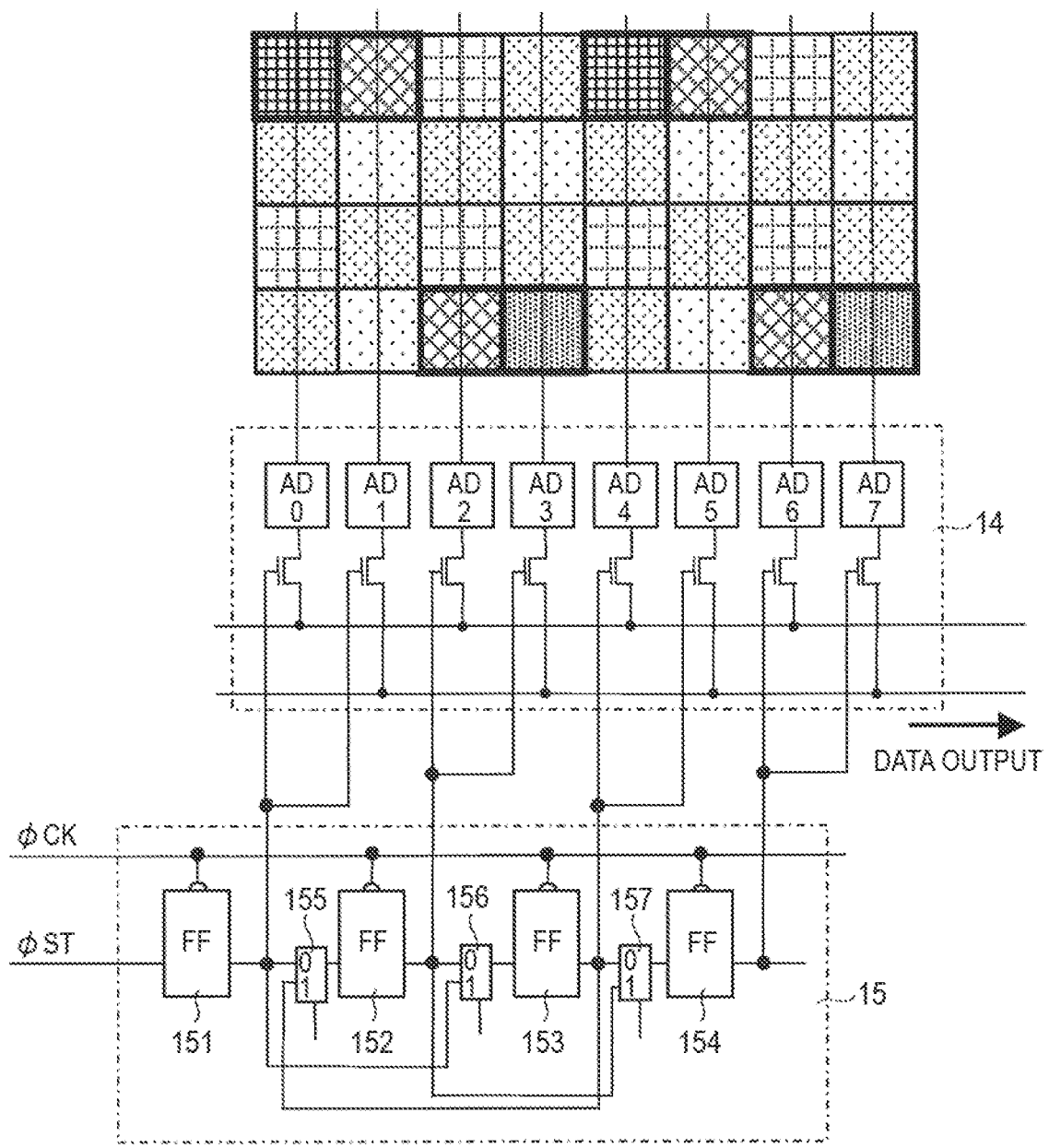
FIG. 8 is a block diagram showing an example of a structure of a column scanning section in the case where a method of changing a column scanning order is adopted.

FIG. 8 shows an example of a structure of the column scanning section 15 in the case where the latter method, that is, the method of changing the column scan order is adopted. FIG. 8 shows the pixel arrangement of 4 vertical pixels×8 horizontal pixels. In FIG. 8, a pixel of an object to be read is surrounded by a thick line.

In the case of the pixel arrangement of the 8 horizontal pixels, the column scanning section 15 includes four flip-flops 151 to 154. That is, in the case of the two-row simultaneous readout, the column scanning section 15 includes the flip-flops the number of which is ½ of the number of pixels in the horizontal direction.

Besides, switches 155 to 157 to select input pulses are provided on the input side of the second and later flip-flops 152 to 154. These switches 155 to 157 receive the respective output pulses of the former stage flip-flops 151 to 153 as "0" inputs. Then, the second switch 155 receives the output pulse of the third stage flip-flop 153 as a "1" input, the second switch 156 receives the output pulse of the first stage flip-flop 151 as a "1" input, and the third switch 157 receives the output pulse of the second stage flip-flop 152 as a "1" input.

In the column scanning section 15 having the above structure, a start pulse φST is inputted to the first stage flip-flop 151, and the flip-flops 152 to 154 perform the shift operation in synchronization with a horizontal clock φCK. The start pulse φST and the horizontal clock φCK are given from the system control section 16.

Here, when all the switches 155 to 157 are set to the "0" side input, shift pulses are successively outputted from the flip-flops 152 to 154, and the shift pulses are given as horizontal scan pulses to the column processing section 14, so that the column scan is performed. Then, the first row and the fourth row are alternately scanned in units of two columns by the column scan of the column scanning section 15. In the case of the column scan, as described before, the pixel data is outputted over the two rows of the first row and the fourth row.

On the other hand, when all the switches 155 to 157 are set to the "1" side input, the output pulse of the first stage flip-flop 151 is inputted to the third stage flip-flop 153. Besides, the output pulse of the third stage flip-flop 153 is inputted to the second stage flip-flop 152, and the output pulse of the second stage flip-flop 152 is inputted to the fourth stage flip-flop 154.

By this, the shift pulses are outputted from the respective stages in order of the flip-flop 151→the flip-flop 153→the flip-flop 152→the flip-flop 154, and the shift pulses become the horizontal scan pulses so that the column scan is per-formed. Then, by the column scan of the column scanning section 15, first, the first row is scanned at intervals of two pixels (skip of two columns), and next, the fourth row is scanned at intervals of two pixels, so that the pixel data can be outputted in order of pixel row.

(Scan Mode of Single Pixel Row)

As described before, the row scanning section 13 can selectively adopt the mode of simultaneously scanning plural pixel rows in addition to the mode of scanning pixel rows in sequence one row by one row without performing the horizontal thinning-out readout. A specific drive example of the CMOS image sensor 10A in the case of the mode of scanning the single pixel row will be described.

The row scanning section 13 simultaneously outputs two drive signals (transfer pulse φTRF, reset pulse φRST and selection pulse φSEL) to a single pixel row, and gives the two drive signals to the respective pixels 20 through the two systematic pixel drive lines 17A and 17B. The one-row whole-column readout of the related art can be realized by the row scan of the row scanning section 13.

Figure 9A:
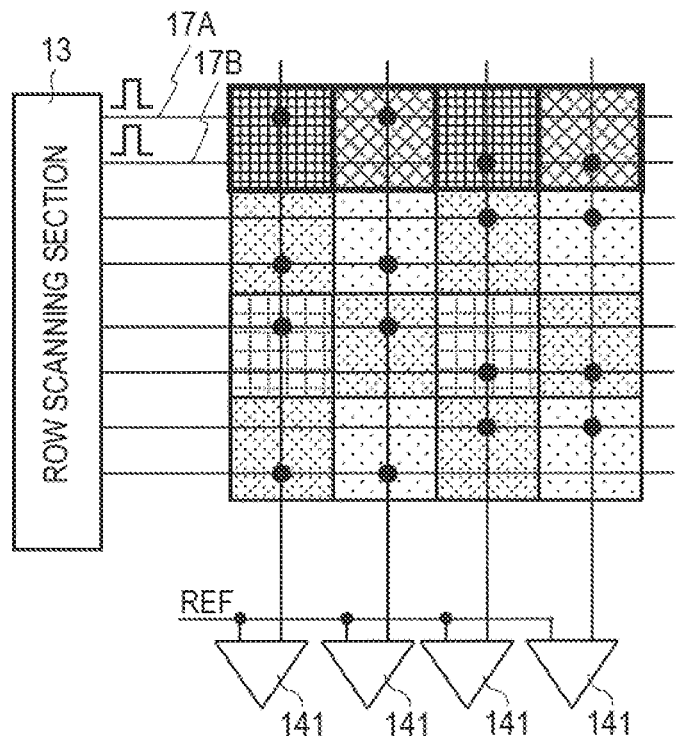
FIGS. 9A and 9B are operation explanatory views of a drive example of a scan mode of a single pixel row in the CMOS image sensor of the first embodiment.
Figure 9B:
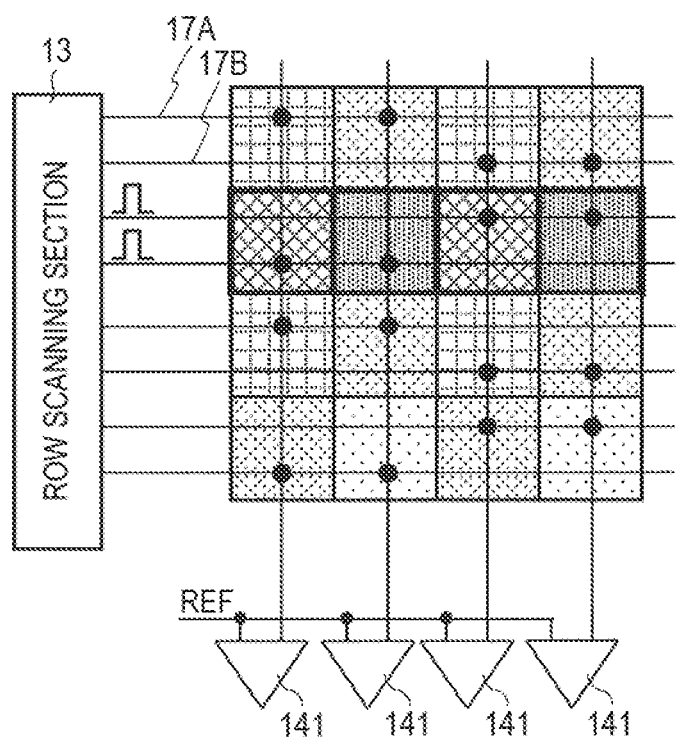

Specifically, first, the row scanning section 13 simultaneously outputs two drive signals to the first row. By this, as shown in FIG. 9A, signals of the respective pixels of RGRG . . . of the first row are simultaneously read out through the vertical signal lines 18. Next, the row scanning section 13 simultaneously outputs two drive signals to the second row, so that as shown in FIG. 9B, signals of the respective pixels of GBGB . . . of the second row are simultaneously read out through the vertical signal lines 18.

After this, similarly, the row scan of the row scanning section 13 is performed in order of the third row, the fourth row, . . . , so that signals can be successively read out from the pixels 20 for all columns one row by one row. Incidentally, in FIGS. 9A and 9B, a pixel of a readout object is surrounded by a thick line.

3. Second Embodiment

Figure 10:
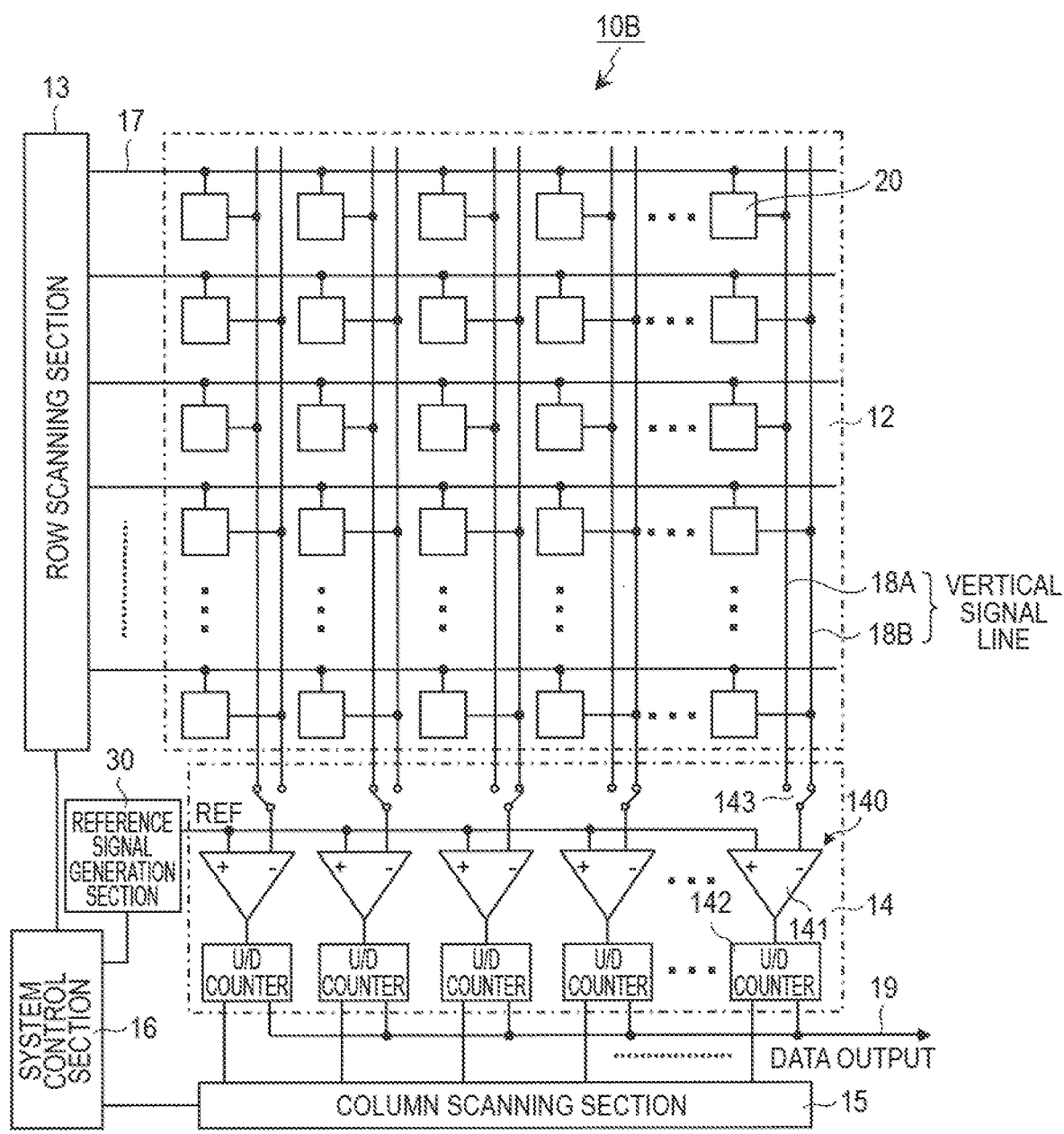
FIG. 10 is a system structural view showing the outline of a system structure of a CMOS image sensor of a second embodiment of the invention.

FIG. 10 is a system structural view showing the outline of a system structure of a CMOS image sensor 10B of a second embodiment. In the drawing, the same portion as that of FIG. 3 is denoted by the same reference numeral.

The CMOS image sensor 10B of this embodiment has a structure in which plural, for example, two systematic (two lines) vertical signal lines 18 are arranged for each pixel column. Unit pixels 20 are alternately connected to the two systematic vertical signal lines 18A and 18B for the respective pixel rows. Specifically, the connection relation is such that each of the pixels 20 of the first pixel row from above in the drawing is connected to the vertical signal line 18A, and each of the pixels 20 of the second pixel row is connected to the vertical signal line 18B, each of the pixels 20 of the third pixel row is connected to the vertical signal line 18A, and so on.

One systematic pixel drive line 17 is arranged for each pixel row. The unit pixels 20 are connected to the pixel drive line 17 for each pixel row. Incidentally, although FIGS. 10A and 10B shows one wiring line as one systematic pixel drive line 17, when the unit pixel 20 has the pixel structure as shown in FIG. 2, the pixel drive line 17 includes, for example, three lines of the transfer line 171, the reset line 172 and the selection line 173.

When the respective pixels 20 are connected to the vertical signal lines 18A and 18B, similarly to the case of the pixel drive lines 17A and 17B of the first embodiment, they may be directly connected, or when there is room in size of a chip 11, a connection structure in which switches intervene can be adopted. When the unit pixel 20 has the pixel structure shown in FIG. 2, a connection place of the pixel 20 to the vertical signal line 18A, 18B is the source electrode of the selection transistor 25.

When the switch intervenes between the unit pixel 20 and the vertical signal line 18A, 18B, the source electrodes of the selection transistors 25 are connected to the vertical signal lines 18A and 18B through the switches for all the pixel columns. As described above, since the switch intervenes between the unit pixel 20 and the vertical signal line 18A, 18B, by switching over the switch, it is possible to select which of the vertical signal lines 18A and 18B is connected to the unit pixel 20. Accordingly, the rearrangement of connection between the vertical signal lines 18A and 18B and the unit pixel 20 can be freely performed.

The two systematic vertical signal lines 18A and 18B are arranged for each pixel column, and the row scanning section 13 can selectively adopt a mode of scanning a single pixel row and a mode of simultaneously scanning plural pixel rows. The mode is switched over under the control of a system control section 16 based on a designation from the outside.

In the case of the scan mode of the single pixel row, the row scanning section 13 outputs drive signals (transfer pulse φTRF, reset pulse φRST and selection pulse φSEL) in sequence for each pixel row, and performs the row scan. According to the row scan of the row scanning section 13, similarly to the related art, while a readout row is selected in sequence for each pixel row, signals can be read out from the respective pixels of the selected row.

In the case of the simultaneous scan mode of the plural pixel rows, the row scanning section 13 simultaneously outputs drive signals (transfer pulse φTRF, reset pulse φRST and selection pulse φSEL) to the two pixel rows connected to the different vertical signal lines 18A and 18B, and performs the row scan. By the row scan of the row scanning section 13, the signals of the respective pixels 20 of the one pixel row are read out to the one vertical signal line 18A, and the signals of the respective pixels 20 of the other pixel row are read out to the other vertical signal line 18B, and the signals are supplied to the column processing section 14.

Similarly to the case of the first embodiment, the simultaneous output of the drive signals to the two pixel rows can be easily realized in such a manner that in the row scanning section 13, two addresses of the pixel rows as the object of the simultaneous readout are specified, or one address is specified, and the thinning-out number (number of rows) or the simultaneous selection number is specified.

Similarly to the first embodiment, the column processing section 14 adopts a column AD conversion system in which an analog pixel signal is AD-converted into a digital signal for each pixel column. The column processing section 14 of the embodiment includes a selection switch 143 on a front stage of an AD conversion circuit 140 including at least a comparator 141 and a counter 142, specifically on an inverting input terminal side of the comparator 141.

In the selection switch 143, two fixed contacts are respectively connected to the two systematic vertical signal lines 18A and 18B, and a movable contact is connected to the inverting input terminal of the comparator 141. The selection switch 143 gives an analog pixel signal transmitted through one of the vertical signal lines 18A and 18B to the inverting input terminal of the comparator 141. The selection of the vertical signal lines 18A/18B by the selection switch 143 can be performed by the control of the system control section 16 based on a designation from the outside.

In the case of this example in which the two systematic vertical signal lines 18 are used, the selection switch 143 selects one of the vertical signal lines 18A and 18B in units of two adjacent pixel columns. Specifically, the selection switch 143 alternately selects pixel columns in units of two pixel columns such that the vertical signal line 18A is selected for the first and the second pixel columns, the vertical signal line 18B is selected for the third and the fourth pixel columns, the vertical signal line 18A is selected for the fifth and the sixth pixel columns, and so on.

That is, the selection switch 143 selects different systematic line signals in units of plural pixel columns with respect to the plural systematic line signals transmitted through the plural systematic vertical signal lines 18 (the details will be described later). A readout row from which pixel signals are read out can be selected for each pixel column by the simultaneous output of drive signals to the two pixel rows by the row scanning section 13 in the simultaneous scan mode of the plural pixel rows and the selection of the vertical signal lines 18A and 18B by the selection switch 143. As a result, in the case of this example, the two-row simultaneous readout can be performed for different pixel columns.

(Simultaneous Scan Mode of Plural Pixel Rows)

Figure 11:
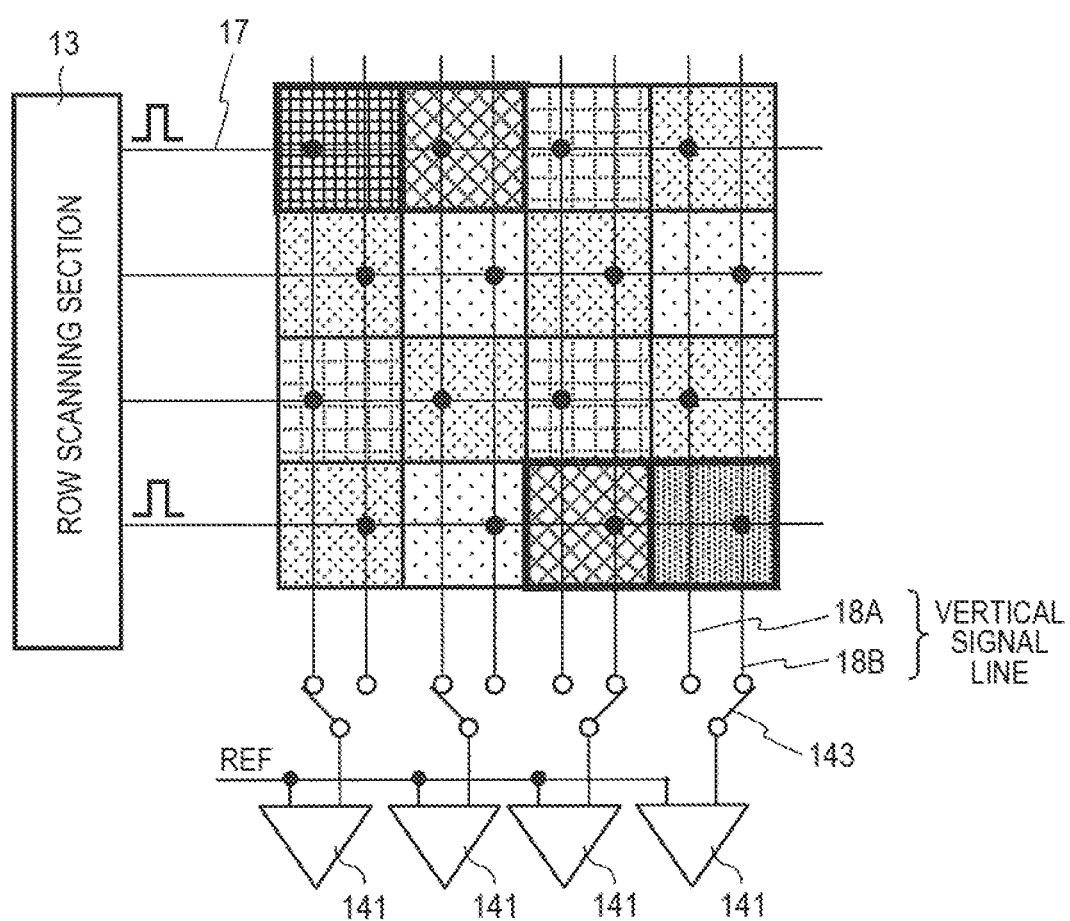
FIG. 11 is an operation explanatory view of a drive example of a simultaneous scan mode of plural pixel rows in the CMOS image sensor of the second embodiment of the invention.

Next, a specific drive example of the CMOS image sensor 10B in the case of the mode of simultaneously scanning the plural pixel rows will be described by use of an operation explanatory view of FIG. 11.

Figure 5:
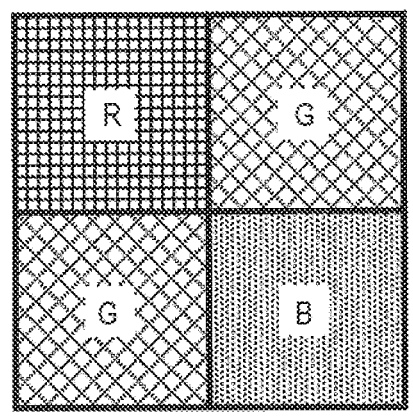
FIG. 5 is a view showing color coding of the RGB Bayer arrangement.
Figure 6:
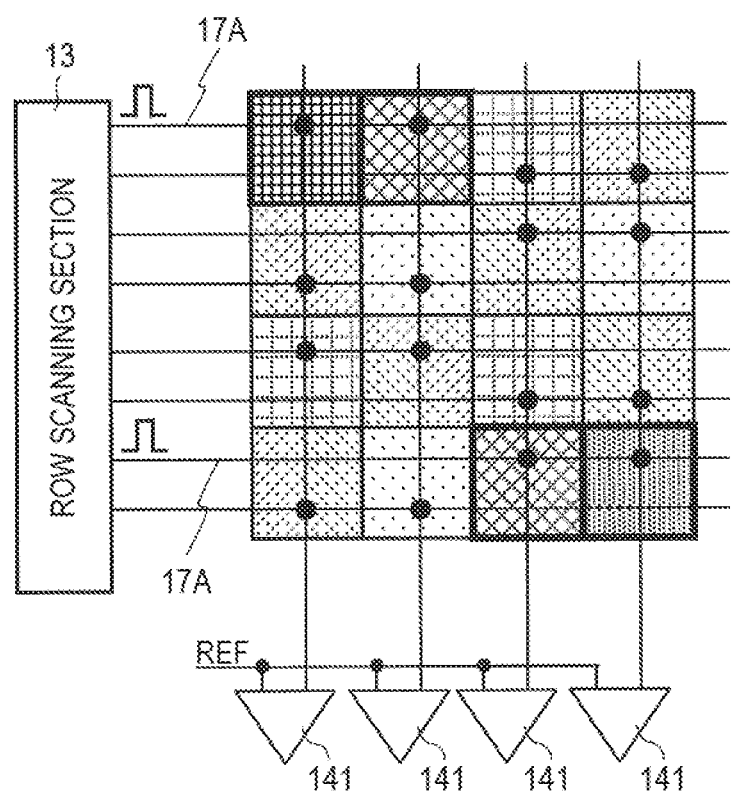
FIG. 6 is an operation explanatory view of a drive example of a simultaneous scan mode of plural pixel rows in the CMOS image sensor of the first embodiment.

Also here, it is assumed that the color coding of color filters arranged on the pixel array section 12 is the RGB Bayer arrangement (see FIGS. 5A and 5B). FIG. 11 shows a pixel arrangement of 4 vertical pixels×4 horizontal pixels for simplification of the drawing. Besides, in FIG. 11, a pixel of a readout object is surrounded by a thick line.

In the operation explanation, as an example, it is assumed that vertical ⅓ thinning-out readout is performed in which three pixel rows are made a unit, two rows among three rows are skipped, and signals are read out from pixels of the remaining one row. As described in the first embodiment, since the vertical readout number (number of rows/number of lines) can be reduced by performing the vertical thinning-out readout, as compared with case where the vertical thinning-out readout is not performed, high-speed image pickup can be realized.

When the vertical ⅓ thinning-out readout is performed, the row scanning section 13 simultaneously outputs drive signals (transfer pulse φTRF, reset pulse φRST and selection pulse φSEL) through the pixel drive lines 17 to the first and the fourth pixel rows from above.

By the row scan of the row scanning section 13, signals of repetition of RGRG . . . of the respective pixels are read out from the first pixel row to the vertical signal lines 18A, and signals of repetition of GBGB . . . of the respective pixels are read out from the fourth pixel row to the vertical signal lines 18B. At this time, the selection switches 143 provided for every two columns, that is, the first column, the second column, the fifth column, the sixth column, . . . select the vertical signal lines 18A, and the selection switches 143 provided for every two columns, that is, the third column, the fourth column, the seventh column, the eighth columns, . . . select the vertical signal lines 18B.

By this, at the time of the simultaneous scan of the first row and the fourth row by the row scanning section 13, finally, with respect to the first pixel row, the signal of the R pixel and the signal of the G pixel are read at intervals of two pixels by the selection switches 143. Besides, with respect to the fourth pixel row, the signal of the G pixel and the signal of the B pixel are read at intervals of two pixels by the selection switches 143. That is, in addition to the vertical ⅓ thinning-out readout, the horizontal 2/4 thinning-out readout is performed by the two-row simultaneous readout.

As described above, for example, the two systematic vertical signal lines 18A and 18B provided for each pixel column are alternately selected by the selection switches 143 in units of two adjacent columns, so that signals can be simultaneously read out from the pixels 20 of two pixel rows for different pixel columns. By this, in the above example, the horizontal 2/4 thinning-out readout can be performed while the vertical ⅓ thinning-out readout is performed.

Then, when attention is paid to one pixel row, since the number of readout pixels in the horizontal direction is halved by the horizontal 2/4 thinning-out readout, as compared with the case where the horizontal thinning-out readout is not performed, the frame rate can be increased. Further, since the number of readout pixels in the horizontal direction can be reduced, the disadvantage that the angle of view is reduced as in the case where the horizontal thinning-out readout is not performed can be eliminated, and therefore, it is possible to prevent the pickup image from becoming long sideways.

Incidentally, in this operation example, although the description is made while using, as the example, the case where the two-row simultaneous readout is performed, no limitation is made to the two-row simultaneous readout. In the case of three-row simultaneous readout, the number of readout pixels in the horizontal direction can be reduced to ⅓. In the case of four-row simultaneous readout, the number of readout pixels in the horizontal direction can be reduced to ¼.

Besides, in this operation example, in order to reduce the vertical readout number (number of rows/number of lines), the case of using the vertical thinning-out readout method to skip the pixel rows at the constant row period is used as the example, however, no limitation is made to this method. For example, a method of vertical segmentation to read signals of pixels within a specific area in the vertical direction can be used, or both the method of vertical thinning-out readout and the method of vertical segmentation can be used. The operation and effect of the case where these methods are adopted are the same as that of the case of the first embodiment (see FIGS. 7A and 7B).

Similarly to the case of the first embodiment, the latter stage data processing section performs signal processing corresponding to the output over two rows on the pixel data outputted over the two rows. Specifically, as an example, signal processing for each row may be performed after the pixel data of two rows are read out.

Besides, when the compatibility of the data processing section to the normal one-row readout and the two-row simultaneous readout is raised, an image memory such as a line memory or a frame memory is used, the pixel data is once stored in the image memory, and the pixel data may be rearranged in order of pixel row and outputted. Alternatively, the column scanning section of the structural example shown in FIG. 8 is used, and the pixel data may be outputted in order of pixel row by changing the order of column scan.

(Scan Mode of Single Pixel Row)

As described before, the row scanning section 13 can selectively adopt the mode of scanning pixel rows in sequence one row by one row without performing horizontal thinning-out readout in addition to the mode of simultaneously scanning plural pixel rows. A specific drive example of the CMOS image sensor 10B in the case of the mode of scanning the single pixel row will be described.

The row scanning section 13 outputs drive signals (transfer pulse φTRF, reset pulse φRST and selection pulse φSEL) to a single pixel row in sequence from the first row, and gives the drive signals to the respective pixels 20 through the one systematic pixel drive line 17.

Figure 12A:
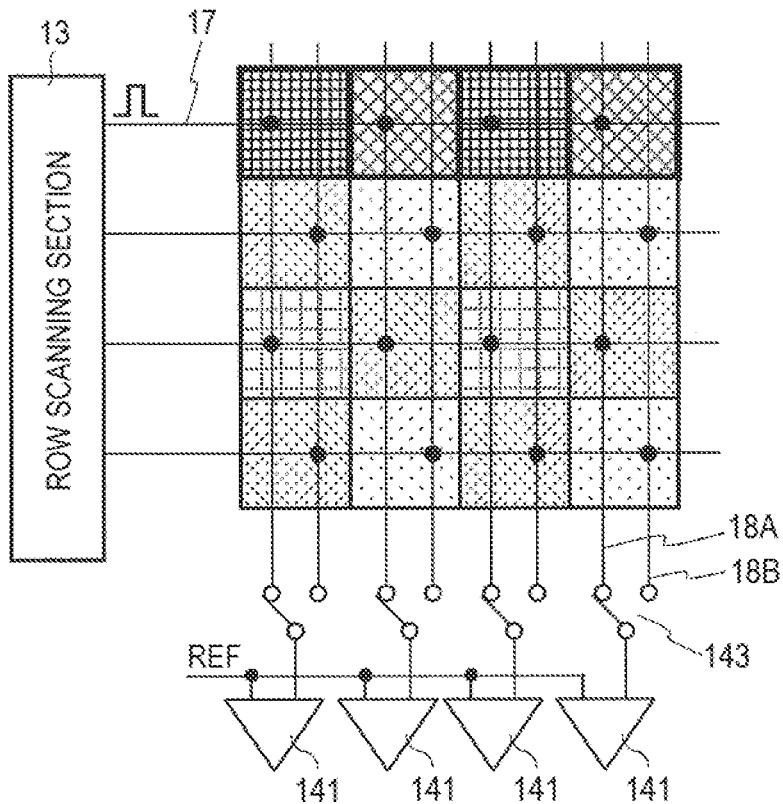
FIGS. 12A and 12B are operation explanatory views of a drive example of a scan mode of a single pixel row in the CMOS image sensor of the second embodiment of the invention.
Figure 12B:
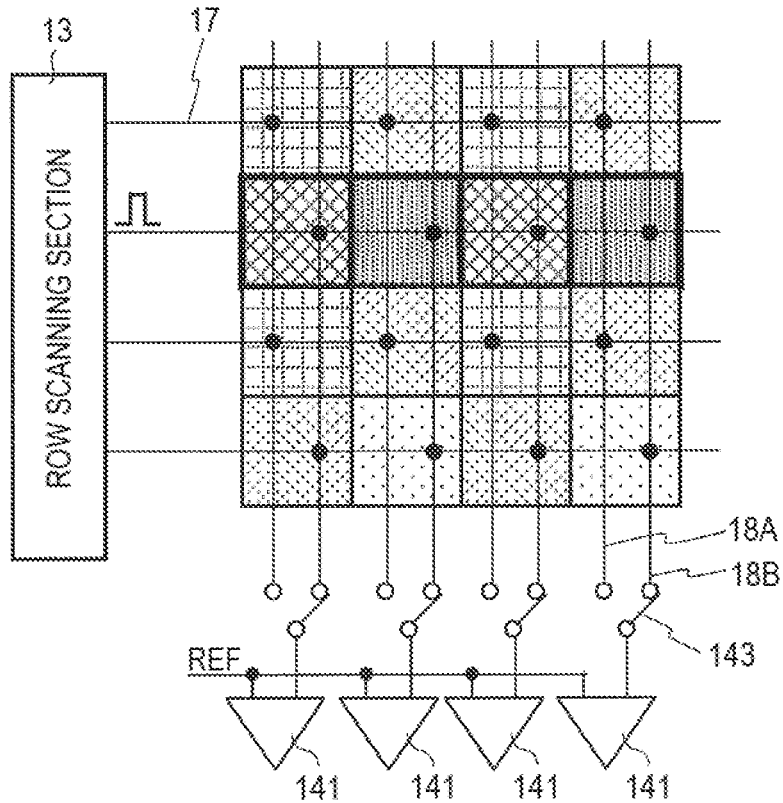

In synchronization with the scan of the row scanning section 13, the system control section 16 performs switching control of the selection switch 143 so that the selection switch 143 selects the same vertical signal line 18A/18B for the same row. Specifically, the system control section 16 performs switching control of the selection switch 143, so that as shown in FIG. 12A, the selection switch 143 selects the vertical signal line 18A at the time of scanning of the odd pixel row. Besides, the system control section 16 performs switching control of the selection switch 143, so that as shown in FIG. 12B, the selection switch 143 selects the vertical signal line 18B at the time of scanning of the even pixel row.

By this, at the time of scanning of the odd pixel row, the signals of repetition of RGRG . . . of the respective pixels are read out from the odd pixel row to the vertical signal lines 18A and are supplied to the column processing section 14 through the selection switches 143. Besides, at the time of scanning of the even pixel row, signals of repetition of GBGB . . . of the respective pixels are read out to the vertical signal lines 18B and are supplied to the column processing section 14 through the selection switches 143.

By the above, the one-row whole-column readout of the related art can be realized. That is, signals can be read out from the pixels 20 for all columns in sequence one row by one row without performing the horizontal thinning-out readout. Incidentally, in FIGS. 12A and 12B, the pixel of the readout object is surrounded by the thick line.

4. Third Embodiment

Figure 13:
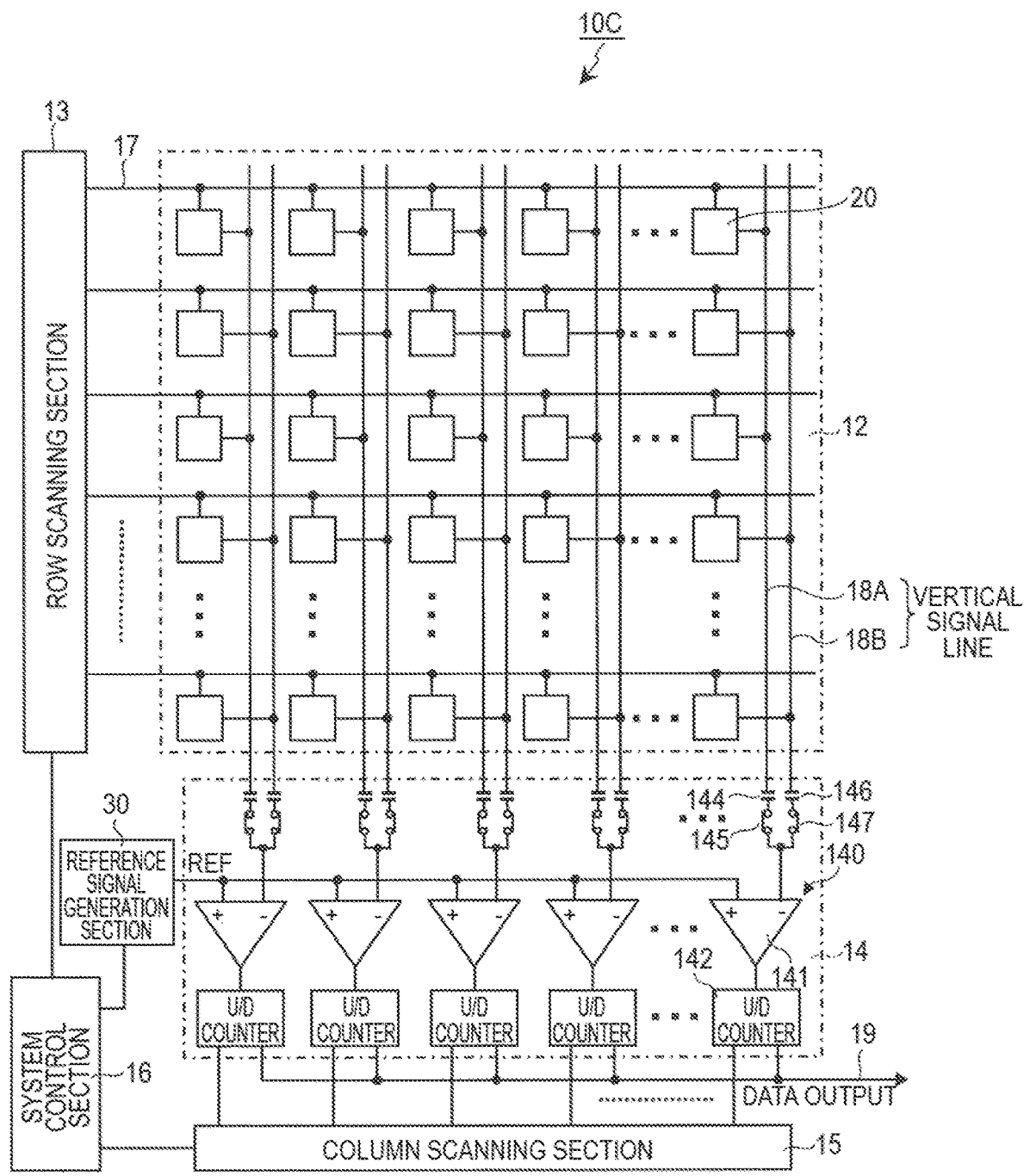
FIG. 13 is a system structural view showing the outline of a system structure of a CMOS image sensor of a third embodiment of the invention.

FIG. 13 is a system structural view showing the outline of a system structure of a CMOS image sensor 10C of a third embodiment. In the drawing, the same portion as that of FIGS. 10A and 10B is denoted by the same reference numeral.

In the CMOS image sensor 10B of the second embodiment, for example, the two systematic vertical signal lines 18A and 18B are arranged for each pixel column. Then, the vertical signal lines 18A and 18B are alternately selected in units of two adjacent columns by the selection switch 143, and the signals are read out simultaneously from the pixels 20 of two pixel rows for different pixel columns, so that the horizontal thinning-out readout is performed while the vertical thinning-out readout is performed.

The CMOS image sensor 10C of this embodiment is the same as the CMOS image sensor 10B of the second embodiment in that plural, for example, two systematic vertical signal lines 18A 18B are provided for each pixel column, and signals are simultaneously read out from pixels 20 of two pixel rows. In addition to this, the CMOS image sensor 10C of this embodiment includes a capacitor 144 and a switch 145 connected in series to the end of the vertical signal line 18A and a capacitor 146 and a switch 147 connected in series to the end of the vertical signal line 18B.

The respective output ends of the switches 145 and 147 are connected in common to an inverting input terminal of a comparator 141. That is, the respective ends of the vertical signal lines 18A and 18B are AC-connected by the capacitors 144 and 146 through the switches 145 and 147. The signals of two pixels in the vertical direction, which are simultaneously read out through the vertical signal lines 18A and 18B, are stored in the capacitors 144 and 146, so that the signals are added between the two pixels.

In this example, the respective pixels of odd rows are connected to the vertical signal lines 18A, and the respective pixels of even rows are connected to the vertical signal lines 18B. Accordingly, when both the switches 145 and 147 are in the ON (closed) state, two-pixel addition (vertical two-pixel addition) is performed between two adjacent rows in the vertical direction by the row scan of the row scanning section 13. It is appropriate that the vertical two-pixel addition in this case is performed when a color filter is a monochrome filter.

Here, although the case where the vertical pixel addition is performed between the odd row and the even row is used as the example, the vertical addition between odd rows or the vertical addition between even rows can also be performed by changing the connection relation of the respective pixel rows with respect to the vertical signal lines 18A and 18B. This vertical addition is useful for the case where color filters have the Bayer arrangement (see FIGS. 5A and 5B) described before.

Incidentally, the one-row whole-column readout of the related art can be realized by alternately on/off driving the switches 145 and 147 in synchronization with the row scanning of the row scanning section 13. That is, signals can be read out from the pixels 20 of all columns in sequence one row by one row without performing the horizontal thinning-out readout. The on/off driving of the switches 145 and 147 synchronous with the row scan is performed under the control of the system control section 16.

As described above, according to the CMOS image sensor 10C of the third embodiment, the plural systematic vertical signal lines 18 are provided for each pixel column, and signals of the respective pixels of plural rows are simultaneously read out to the plural systematic vertical signal lines 18, so that the vertical addition can be performed between the plural pixel rows. Since the signal level can be increased by this vertical addition, the sensitivity can be improved.

The signal addition between the pixels in the vertical direction can also be performed by an AD conversion circuit 140. However, when the signal addition is performed by the AD conversion circuit 140, since it is necessary to perform the AD conversion processing twice, the time of the AD conversion is increased, and the frame rate is reduced. On the other hand, when the signal addition is performed by the analog addition of the capacitors 144 and 146, since the AD conversion time may be the same as that at the non-addition time, there is a merit that the sensitivity can be improved without reducing the frame rate.

5. Fourth Embodiment

Figure 14:
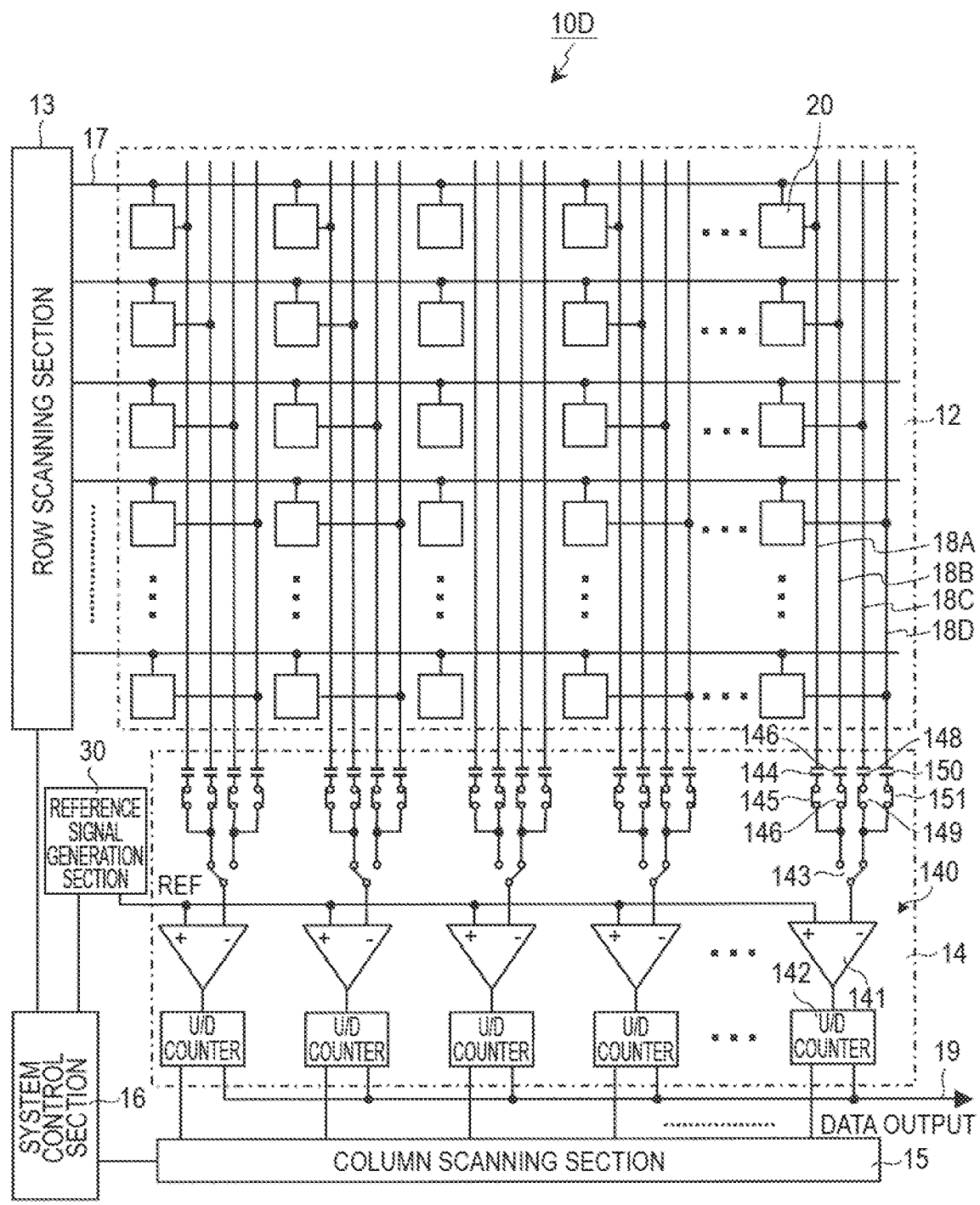
FIG. 14 is a system structural view showing the outline of a system structure of a CMOS image sensor of a fourth embodiment of the invention.

FIG. 14 is a system structural view showing the outline of a system structure of a CMOS image sensor 10D of a fourth embodiment of the invention. In the drawing, the same portion as that of FIGS. 10A, 10B and 10C and FIG. 13 is denoted by the same reference numeral.

The CMOS image sensor 10D of this embodiment has both the function of the CMOS image sensor 10B of the second embodiment and the function of the CMOS image sensor 10C of the third embodiment. As described before, the CMOS image sensor 10B of the second embodiment has the function to perform the horizontal thinning-out readout while performing the vertical thinning-out readout. The CMOS image sensor 10C of the third embodiment has the function to improve the sensitivity by the vertical addition.

That is, the functions of the CMOS image sensors 10C and 10D of the second and the third embodiments are independent functions. In the CMOS image sensor 10D of this embodiment, the independent functions are combined. That is, the CMOS image sensor 10D of this embodiment has such a structure that the horizontal thinning-out readout of simultaneously reading signals from the respective pixels of, for example, two pixel rows for different pixel columns is performed and the vertical addition is performed between, for example, two pixel rows.

Specifically, in the CMOS image sensor 10D of this embodiment, for example, four systematic (four lines) vertical signal lines 18A, 18B, 18C and 18D are arranged for each pixel column. A capacitor 144 and a switch 145 are connected in series to an end of the vertical signal line 18A. A capacitor 146 and a switch 147 are connected in series to an end of the vertical signal line 18B. The respective output ends of switches 145 and 147 are connected in common.

A capacitor 148 and a switch 149 are connected in series to an end of the vertical signal line 18C. A capacitor 150 and a switch 151 are connected in series to an end of the vertical signal line 18D. The respective output ends of the switches 149 and 151 are connected in common. A selection switch 143 is provided to an inverting input terminal side of a comparator 141.

Two fixed contacts of the selection switch 143 are connected to a common connection node of the switches 145 and 147 and a common connection node of the switches 149 and 151. Here, as is apparent from the operation explanation of the second and the third embodiments, the selection switch 143 functions to select and output different systematic line signals in units of plural pixel columns with respect to plural systematic line signals obtained by the addition processing of the capacitors.

According to the CMOS image sensor 10D of the fourth embodiment, signals are simultaneously read out from the respective pixels of plural pixel rows for different pixel columns to perform the horizontal thinning-out readout and the angle of view is improved, and further, the vertical addition is performed between plural pixel rows and the sensitivity can be improved.

Since the CMOS image sensors 10A to 10D of the first to the fourth embodiments have the structure in which plural systematic wiring lines are provided for each pixel row or each pixel column, the wiring lines of the pixel array section 13 are increased. As a result, since the amount of incident light to the unit pixel 20 is decreased, there is a fear that the sensitivity is reduced. However, this fear can be eliminated by adopting a back surface incident type pixel structure in which incident light is captured from the opposite side to a wiring layer, instead of a front surface incident type pixel structure in which incident light is captured from the wiring layer side.

6. Back Surface Incident Type Pixel Structure

Figure 15:
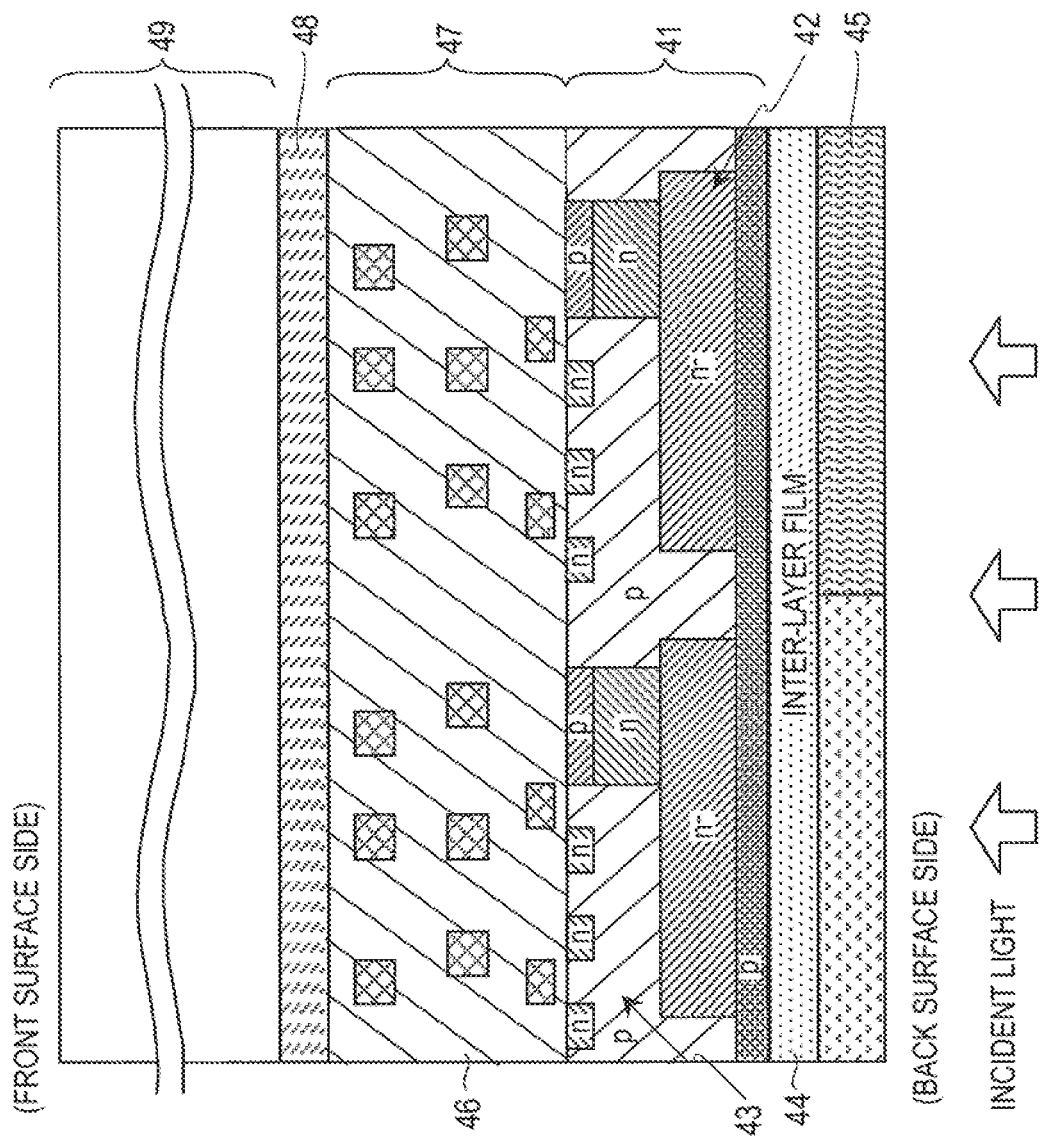
FIG. 15 is a sectional view showing a pixel structure of a back surface incident type.

FIG. 15 is a sectional view showing an example of a back surface incident type pixel structure. Here, a sectional structure of two pixels is shown.

In FIG. 15, a photodiode 42 and a pixel transistor 43 are formed in a silicon section 41. That is, the silicon section 41 is a component formation section. Here, the photodiode 42 corresponds to the photodiode 21 of FIG. 2. Besides, the pixel transistor 43 corresponds to the transistors 22 to 25 of FIG. 2.

A color filter 45 is formed on one surface side of the silicon section 41 through an inter-layer film 44. By this, light incident on the one surface side of the silicon section 41 is guided to a light receiving surface of the photodiode 42 through the color filter 45. On the other hand, a wiring layer 47 including an inter-layer insulating film 46 in which gate electrodes of the pixel transistors 43 and metal wiring lines are multilayer-wired is formed on the other surface side of the silicon section 41. A support substrate 49 is bonded to a surface of the wiring layer 47 opposite to the silicon section 41 by an adhesive 48.

In the above pixel structure, the wiring layer 47 side of the silicon section 41 on which the photodiode 42 and the pixel transistor 43 are formed is called a front surface side, and a side of the silicon section 41 opposite to the wiring layer 47 is called a back surface side. Under such definition, since the incident light is captured from the back surface side of the silicon section 41, this pixel structure is a back surface incident type pixel structure.

According to the back surface incident type pixel structure, since the incident light is captured from the surface side opposite to the wiring layer 47, the aperture ratio can be made 100%. Besides, since the wiring layer 47 does not exist on the side where the incident light is captured, the incident light can be condensed on the light receiving surface of the photodiode 42 even if an on-chip lens is not used. Further, like the CMOS image sensors 10A to 10D of the first to the fourth embodiments, even if the structure is adopted in which plural systematic wiring lines are provided for each pixel row or each pixel column, the size of the unit pixel may not be made small, and therefore, there is no fear of reduction in sensitivity.

7. Electronic Equipment

A solid-state imaging apparatus of the embodiment of the invention can be used to be mounted on a general electronic equipment in which a solid-state imaging apparatus is used as an image capture section (photoelectric conversion section). As the electronic equipment, an imaging apparatus (camera systematic) such as a digital still camera or a video camera, a portable terminal apparatus, such as a portable telephone, having an image pickup function, a copying machine using a solid-state imaging apparatus as an image reading section, or the like can be mentioned. Incidentally, there is also a case where a camera module mounted on the electronic equipment is made an imaging apparatus.

(Imaging Apparatus)

FIG. 16 is a block diagram showing an example of a structure of, for example, an imaging apparatus as one of electronic equipments of the embodiment of the invention. As shown in FIG. 16, an imaging apparatus 100 of the embodiment of the invention includes an optical system including a lens group 101, an image pickup element 102, a DSP circuit 103 as a camera signal processing section, a frame memory 104, a display device 105, a recording device 106, an operation system 107 and a power source system 108. The DSP circuit 103, the frame memory 104, the display device 105, the recording device 106, the operation system 107 and the power source system 108 are mutually connected through a bus line 109.

The lens group 101 captures incident light (image light) from a subject and forms an image on the image pickup surface of the image pickup element 102. The image pickup element 102 converts the light amount of the incident light condensed on the image pickup surface by the lens group 101 into an electric signal in units of pixel and outputs it as a pixel signal. As the image pickup element 102, the solid-state imaging apparatus such as the CMOS image sensors of the first to the fourth embodiments can be used.

The display device 105 includes a panel type display device such as a liquid crystal display device or an organic RL (electro luminescence) display device, and displays a moving image or a still image picked up by the image pickup element 102. The recording device 106 records the moving image or the still image picked up by the image pickup element 102 onto a recording medium such as a video tape or a DVD (Digital Versatile Disc).

The operation system 107 issues operation commands concerning various functions of the imaging apparatus under the operation of a user. The power source system 108 suitably supplies various powers as operation powers of the DSP circuit 103, the frame memory 104, the display device 105, the recording device 106 and the operation systematic 107 to these supply objects.

The imaging apparatus 100 as described above is applied to a video camera, a digital still camera or a camera module for a mobile equipment such as a portable telephone. In the imaging apparatus 100, when the CMOS image sensor of the first to the fourth embodiment is used as the image pickup element 102, since the CMOS image sensor suppresses the reduction in angle of view and can prevent a pickup image from becoming long sideways, an excellent pickup image can be provided.

The present application contains subject matter related to that disclosed in Japanese Priority Patent Application JP 2009-114250 filed in the Japan Patent Office on May 11, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
    a plurality of pixels arranged in a matrix including a plurality of columns of pixels and a plurality of rows of pixels, wherein the plurality of pixels comprises:
        a first pixel in a nth row including a first photodiode;
        a second pixel in a (n+1)th row including a second photodiode;
        a third pixel in a (n+2)th row including a third photodiode;
        a fourth pixel in a (n+3)th row including a fourth photodiode;
        a fifth pixel in the nth row including a fifth photodiode;
        a sixth pixel in the nth row including a sixth photodiode; and
        a seventh pixel in the nth row including a seventh photodiode;
    a plurality of vertical signal lines coupled to the plurality of pixels, wherein the plurality of vertical signal lines comprises, for each column of the plurality of columns of pixels in the matrix, a first vertical signal line and a second vertical signal line different from the first vertical signal line;
    a plurality of horizontal pixel drive lines coupled to the plurality of pixels, wherein the plurality of horizontal pixel drive lines comprises a first horizontal pixel drive line and a second horizontal pixel drive line; and
    a plurality of comparators coupled to the plurality of vertical signal lines via switch circuitry, wherein the first pixel, the second pixel, the third pixel and the fourth pixel are in an ith column, wherein the first pixel is adjacent to the fifth pixel, and the sixth pixel is adjacent to the seventh pixel, wherein the first pixel and the third pixel are coupled to the first vertical signal line, and the second pixel and the fourth pixel are coupled to the second vertical signal line, wherein the plurality of comparators includes a first comparator coupled to the first vertical signal line and the second vertical signal line via the switch circuitry, and wherein the first photodiode and the sixth photodiode are configured to receive light within a first range of wavelengths and the fifth photodiode and the seventh photodiode are configured to receive light within a second range of wavelengths different from the first range of wavelengths.

2. The imaging device of claim 1, wherein the second pixel and the fourth pixel are uncoupled to the first vertical signal line.

3. The imaging device of claim 1, wherein the switch circuitry comprises a first switch circuit between the first comparator and the first vertical signal line and a second switch circuit between the first comparator and the second vertical signal line.

4. The imaging device of claim 3, wherein the first comparator is configured to receive a first pixel signal via the first vertical signal line and a second pixel signal via the second vertical signal line.

5. The imaging device of claim 1, wherein the first pixel comprises a first transfer transistor coupled to the first photodiode, and the fifth pixel comprises a second transfer transistor coupled to the second photodiode, and wherein the first horizontal pixel drive line is coupled to a gate of the first transfer transistor and the second horizontal pixel drive line is coupled to a gate of the second transfer transistor.

6. The imaging device of claim 1, wherein the first pixel, the second pixel, the third pixel, the fourth pixel, the fifth pixel, the sixth pixel and the seventh pixel comprise a transfer transistor and pixel switch circuitry, and wherein a gate of the transfer transistor of the first pixel, the fifth pixel, the sixth pixel and the seventh pixel is coupled to one of the first horizontal pixel drive line or the second horizontal pixel drive line through the pixel switch circuitry.

7. The imaging device of claim 1, wherein the fifth pixel is in a (i+1)th column, the sixth pixel is in a (i+2)th column and the seventh pixel is in a (i+3)th column.

8. The imaging device of claim 1, wherein the first range of wavelengths is different from the second range of wavelengths.

9. The imaging device of claim 1, wherein the second photodiode and the fourth photodiode are configured to receive light within a third range of wavelengths, and wherein the third range of wavelengths are different from the first range of wavelengths and the second range of wavelengths.

10. The imaging device of claim 9, further comprising:

a first color filter on the first pixel;
a second color filter on the second pixel;
a third color filter on the third pixel;
a fourth color filter on the fourth pixel;
a fifth color filter on the fifth pixel;
a sixth color filter on the sixth pixel; and
a seventh color filter on the seventh pixel, wherein the first color filter, the third color filter and the sixth color filter are configured to transmit the light within the first range of wavelengths, and the fifth color filter and the seventh color filter are configured to transmit the light within the second range of wavelengths, and the second color filter and the fourth color filter are configured to transmit the light within the third range of wavelengths.

11. The imaging device of claim 1, further comprising a row scanner configured to:

output a control signal through the plurality of horizontal pixel drive lines;

output the control signal to the first pixel through the first horizontal pixel drive line at a first time;

output the control signal to the fifth pixel through the second horizontal pixel drive line at a second time different from the first time in a first mode; and output the control signal to the first pixel and the fifth pixel through the first horizontal pixel drive line and the second horizontal pixel drive line, respectively, at a same time in a second mode.

12. The imaging device of claim 11, further comprising a control section configured to switch modes between the first mode and the second mode.

13. The imaging device of claim 12, wherein the first pixel and the seventh pixel are configured to receive the control signal at the first time, and wherein the fifth pixel and the sixth pixel are configured to receive the control signal at the second time.

14. A light detecting device, comprising:

an imaging device comprising:

a plurality of pixels arranged in a matrix including a plurality of columns of pixels and a plurality of rows of pixels, wherein the plurality of pixels comprises:

a first pixel in a nth row including a first photodiode;
a second pixel in a (n+1)th row including a second photodiode;
a third pixel in a (n+2)th row including a third photodiode;
a fourth pixel in a (n+3)th row including a fourth photodiode;
a fifth pixel in the nth row including a fifth photodiode;
a sixth pixel in the nth row including a sixth photodiode; and
a seventh pixel in the nth row including a seventh photodiode, a plurality of vertical signal lines coupled to the plurality of pixels, wherein the plurality of vertical signal lines comprises, for each column of the plurality of columns of pixels in the matrix, a first vertical signal line and a second vertical signal line different from the first vertical signal line;

a plurality of horizontal pixel drive lines coupled to the plurality of pixels, wherein the plurality of horizontal pixel drive lines comprises a first horizontal pixel drive line and a second horizontal pixel drive line; and a plurality of comparators coupled to the plurality of vertical signal lines via switch circuitry, wherein the first pixel, the second pixel, the third pixel and the fourth pixel are in an ith column, wherein the first pixel is adjacent to the fifth pixel, and the sixth pixel is adjacent to the seventh pixel, wherein the first pixel and the third pixel are coupled to the first vertical signal line, and the second pixel and the fourth pixel are coupled to the second vertical signal line, wherein the plurality of comparators includes a first comparator coupled to the first vertical signal line and the second vertical signal line via the switch circuitry, and wherein the first photodiode and the sixth photodiode are configured to receive light within a first range of wavelengths and the fifth photodiode and the seventh photodiode are configured to receive light within a second range of wavelengths different from the first range of wavelengths.

15. The light detecting device of claim 14,
wherein the second pixel and the fourth pixel are uncoupled to the first vertical signal line.

16. The light detecting device of claim 14,
wherein the switch circuitry comprises a first switch circuit between the first comparator and the first vertical signal line and a second switch circuit between the first comparator and the second vertical signal line.

17. The light detecting device of claim 16,
wherein the first comparator is configured to receive a first pixel signal via the first vertical signal line and a second pixel signal via the second vertical signal line.

18. The light detecting device of claim 14,
wherein the first pixel comprises a first transfer transistor coupled to the first photodiode, and the fifth pixel comprises a second transfer transistor coupled to the second photodiode, and wherein the first horizontal pixel drive line is coupled to a gate of the first transfer transistor and the second horizontal pixel drive line is coupled to a gate of the second transfer transistor.

19. The light detecting device of claim 14,
wherein the first pixel, the second pixel, the third pixel, the fourth pixel, the fifth pixel, the sixth pixel and the seventh pixel comprise a transfer transistor and pixel switch circuitry, and wherein a gate of the transfer transistor of the first pixel, the fifth pixel, the sixth pixel and the seventh pixel is coupled to one of the first horizontal pixel drive line or the second horizontal pixel drive line through the pixel switch circuitry.

20. The light detecting device of claim 14,
wherein the fifth pixel is in a (i+1)th column, the sixth pixel is in a (i+2)th column and the seventh pixel is in a (i+3)th column.

21. The light detecting device of claim 14,
wherein the first range of wavelengths is different from the second range of wavelengths.

22. The light detecting device of claim 14,
wherein the second photodiode and the fourth photodiode are configured to receive light within a third range of wavelengths, and wherein the third range of wavelengths are different from the first range of wavelengths and the second range of wavelengths.

23. The light detecting device of claim 22,
further comprising:
a first color filter on the first pixel;
a second color filter on the second pixel;
a third color filter on the third pixel;
a fourth color filter on the fourth pixel;
a fifth color filter on the fifth pixel;
a sixth color filter on the sixth pixel; and
a seventh color filter on the seventh pixel,
wherein the first color filter, the third color filter and the sixth color filter are configured to transmit the light within the first range of wavelengths, and the fifth color filter and the seventh color filter are configured to transmit the light within the second range of wavelengths, and the second color filter and the fourth color filter are configured to transmit the light within the third range of wavelengths.

24. The light detecting device of claim 14, further comprising a row scanner configured to:
output a control signal through the plurality of horizontal pixel drive lines;
output the control signal to the first pixel through the first horizontal pixel drive line at a first time;
output the control signal to the fifth pixel through the second horizontal pixel drive line at a second time different from the first time in a first mode; and
output the control signal to the first pixel and the fifth pixel through the first horizontal pixel drive line and the second horizontal pixel drive line, respectively, at a same time in a second mode.

25. The light detecting device of claim 24,
further comprising a control section configured to switch modes between the first mode and the second mode.

26. The light detecting device of claim 25,
wherein the first pixel and the seventh pixel are configured to receive the control signal at the first time, and
wherein the fifth pixel and the sixth pixel are configured to receive the control signal at the second time.

* * * * *